United States Patent [19]
Chen et al.

[11] Patent Number: 5,472,759
[45] Date of Patent: Dec. 5, 1995

[54] OPTICAL VOLUME MEMORY

[75] Inventors: Wenpeng Chen, Bethesda; Shekhar Guha, Baltimore; Terrance L. Worchesky, Columbia; Kenneth J. Ritter, Sykesville; Maher E. Tadros; Keith Kang, both of Ellicott City, all of Md.

[73] Assignee: Martin Marietta Corporation, Bethesda, Md.

[21] Appl. No.: 168,733

[22] Filed: Dec. 16, 1993

[51] Int. Cl.$^6$ ............................................. B32B 3/00
[52] U.S. Cl. .......................... 428/65.1; 428/913; 430/270; 430/495; 430/945; 346/137; 346/76.1
[58] Field of Search ............................. 428/64, 65, 913; 430/270, 945; 346/76 L, 135.1

[56] References Cited

U.S. PATENT DOCUMENTS

| | | | |
|---|---|---|---|
| 4,052,706 | 10/1977 | Spitz et al. | 340/173 |
| 4,288,862 | 9/1981 | Ohhinata et al. | 365/181 |
| 4,333,165 | 6/1982 | Swainson et al. | 365/120 |
| 4,927,180 | 5/1990 | Trundle | 283/70 |
| 5,130,058 | 7/1992 | Tanaka | 252/586 |
| 5,192,644 | 3/1993 | Ohta | 430/338 |
| 5,246,758 | 9/1993 | Matsui | 428/64 |
| 5,268,862 | 12/1993 | Rentzepis | 365/151 |
| 5,296,607 | 3/1994 | Tomoda | 548/236 |

FOREIGN PATENT DOCUMENTS

| | | |
|---|---|---|
| 2037059 | 2/1991 | Canada. |
| 9302454 | 2/1993 | WIPO. |
| 9313529 | 7/1993 | WIPO. |

OTHER PUBLICATIONS

"Two–Photon Absorption Allows Data Storage in 3D", Bains, published at pp. 1–2 of OE Reports, vol. 118, published by Society of Photo–Optical Instrumentation Engineers Oct. 1993.

"Two Photon Three Dimensional Memory Hierarchy" by S. Eisner et al, presented at the Jul. 1992 SPIE meeting in San Diego.

"Photochromics of the Future", H. G. Heller, *Electronic Materials from Silicon to Organics*, 1991, edited by L. S. Miller et al, published by Plenum Publishing Corp.

"Potentials of Two–Photon Based 3D Optical Memories for High Performance Computing", May 10, 1990 by Hunter et (List continued on next page.)

*Primary Examiner*—Patrick J. Ryan
*Assistant Examiner*—Elizabeth Evans
*Attorney, Agent, or Firm*—Gay Chin; William H. Meise; Brian J. Rees

[57] ABSTRACT

An optical memory material includes a two-photon storage component which can be written from a first to a second state in response to WRITE light, mixed with a signal component which fluoresces by one-photon absorption only at the written locations in response to READ light. The storage material may be a fulgide. The memory material may also include a frequency upconversion material to aid writing. Writing is performed by a spatial light modulator (SLM) with a dynamic focussing system, for concentrating sufficient power at WRITE locations for nonlinear two-photon absorption. Crosstalk is avoided during simultaneous writing in some embodiments, by spacing the individual WRITE beams apart by an integer number of inter-beam spacings, so that non-adjacent datels are written simultaneously in a "paragraph," and the non-written areas are written at a different time with different paragraphs. The memory material may be translated relative to the SLM to access different paragraphs, or accessed by an electronically sparsed SLM. Reading uses a sheet of READ light traversing the pages of written material to cause the signal component to fluoresce, and imaging the fluorescent pattern onto a detector array. The memory material may be stacked in layers, spaced apart by light waveguides, for guiding the READ beam to the page to be read. In another embodiment, writing and erasure are performed by a modulated quasi-one-dimensional sheet of light, intersecting a second, unmodulated sheet of light at a column within the memory material.

11 Claims, 10 Drawing Sheets

OTHER PUBLICATIONS al, published at pp. 2058–2066 of Applied Optics, vol. 29, No. 14.

"Three–Dimensional Optical Storage Memory", by D. A. Parthenopoulos et al., published at pp. 843–845 of the Aug. 25, 1989 issue of OE reports, published by SPIE, the International Society for Optical Engineering.

"Applications of Photochromic Polymer Films," by A. E. J. Wilson, published at pp. 232–238 of vol. 15, 1984 issue of Phys. Technol., printed in Northern Ireland.

OPTICAL VOLUME MEMORY

FIELD OF THE INVENTION

This invention relates to rewriteable data memories, and more specifically to memories into which data may be written, and from which the recorded data may be read, by means of light, and in which the data is stored in the form of various states of the material of the memory.

BACKGROUND OF THE INVENTION

Data storage memories are widely used in computers and control systems of various types. Computers and control processors ordinarily use electronic random-access memories (RAMs) to aid in performing their processes. Such electronic RAMs have the advantage of high operating speed, but their volume storage density is relatively low, and they are volatile, in that the data stored therein is lost when the system is deenergized. To save the data in a volatile RAM preparatory to deenergization, the data is ordinarily transferred to a rewriteable permanent medium such as magnetic disc or magnetic tape. Disc and tape media are capable of storing large amounts of data, but have substantial initial access time requirements to initially access or locate the data, and also have data transfer rates which are limited by the serial nature of the tape or the track on a disc. These different memory types constitute a hierarchy which lacks fast access time, high storage capacity members.

Three-dimensional (3D) optical storage RAMs have been described, in which light beams address data elements (datels, also known as voxels) within the volume of the memory material, for writing data thereto, and for reading. An article entitled *Applications of Photochromic Polymer Films*, by A. E. J. Wilson, published at pp 232–238 of Volume 15, 1984 issue of Phys. Technol., printed in Northern Ireland, describes photochromic materials generally, their applications to optical data recording, and also lists desirable aspects of an erasable reusable optical recording medium, which include (1) high sensitivity for writing and erasing, (2) high storage capacity in bits per $cm^2$, (3) nondestructive readout, (4) lack of fatigue, which is the ability to be cycled repeatedly without losing its characteristics, (5) archival storage or persistence of more than 10 years, (6) no requirement for development of the image, and (7) low cost and ease of fabrication. Canadian patent application 2,037,059, filed Feb. 26, 1991 in the name of Daniels, and laid open Aug. 27, 1992, describes a system using liquid crystals as the memory material, which are stained with a dye. A slight electric field is applied across the memory. Writing is accomplished by a light beam, which heats the dye through which the beam passes, and the heat is transferred to the adjacent or contiguous liquid crystal datels, to allow them to change state under the influence of the electric field. In one embodiment of the Daniels memory, the heating is accomplished by multiple intersecting beams of light. Patent Cooperation Treaty (PCT) patent application WO93/02454, filed in the name of Strickler, and laid open Feb. 4, 1993, describes development of a three-dimensional optical memory in which a fluorescent dye is the storage medium, but which is undesirable because of photobleaching, and also describes an improved three-dimensional optical memory in which changes in the refractive index of a photopolymer are used for storage, and in which intersecting beams of light are used to detect inhomogeneities (regions of altered index of refraction) in the medium. An article entitled *Three-Dimensional Optical Storage Memory*, authored by D. A. Parthenopoulos et al., and published at pp 843–845 of the Aug. 25, 1989 issue of OE Reports, published by SPIE, the International Society for Optical Engineering, describes a three-dimensional optical memory based on volume storage in an amplitude-recording medium, specifically the photochromic molecule spirobenzopyran, which in a I (spiropyran) state absorbs visible light by a two-photon absorption process (simultaneous absorption of two visible-light photons, corresponding to energy in the ultraviolet or UV range), and when excited takes on a II (merocyanine) state. The I state may correspond to an unwritten (logic 0) state, so that writing involves application of ultraviolet-energy light to create a II state in the datel region. The II state absorbs light in the green-red region of the visible light spectrum, and emits red-shifted fluorescence when excited with green light. Thus, reading is accomplished by applying a beam of green light to the datel, and the red shift identifies the written (logic 1) state. The persistence of the II state, however, ranges from a few minutes under ordinary conditions to a few weeks when cooled. An article entitled *Potentials of two-photon based 3-D optical memories for high performance computing*, by Hunter et al., published at pp 2058–2066 of Applied Optics, Vol. 29, No.14, 10 May 1990, also discusses the use of spirobenzopyran. The text *Electronic Materials From Silicon to Organics*, edited by L. S. Miller et al., and published by Plenum Publishing Corporation, 1991, includes at pp 471–483 a chapter entitled *Photochromics of the Future*, authored by H. G. Heller, which notes that the main reason that organic photochromic materials have not been developed for commercial applications is the problem of fatigue, and which describes the properties of fulgides and heliotropic compounds. An article entitled *Two Photon Three Dimensional Memory Hierarchy*, by S. Esner et al., presented at the July, 1992 SPIE meeting at San Diego, describes the abovementioned hierarchy of memories for use in computers and processors, and also describes two-photon secondary storage (memory) systems which have the potential for millisecond access time and Tbit/sec data transfer rates, in which spirobenzopyran material in a 3-dimensional memory is written by intersecting beams of light, and in which an HCl component of the memory material provides permanent stability of the written form. However, permanent stability implies an inability to erase and re-write, or to overwrite.

It should be noted that the abovementioned different colors of light are established by their wavelengths, which range in the visible spectrum from about 400 to 700 nanometers (nm), and it is also noted that wavelength and frequency of light are inversely related by the velocity of propagation of light (C). The velocity of light is constant within a particular medium, but different media exhibit different values of C.

Improved memories are desired.

SUMMARY OF THE INVENTION

A light-controlled memory stores data in the form of one of a plurality of states of a multipartite memory material. Each bit of data is stored at a data element (datel) location, which may be at the surface of the memory material, or which may be within the bulk material. The memory material is a combination of a storage component or material which changes state in response to a WRITE light and a readout or signal component or material which provides an indication of the state of the storage material at its location. The storage component may change state in response to two-photon absorption of the WRITE light, and the signal component may respond by one-photon absorption of a READ light. The memory material may also include a harmonic generation or frequency up-conversion material which translates light wavelength for generating the WRITE light which is absorbed by the storage component of the memory material. In a particular embodiment of the invention, the memory material includes a mixture of a frequency up-conversion material such as an "up-conversion" dye, a photochromic storage material, and a fluorescent material such as a "signal" dye, which responds to the local state of the adjacent photochromic material. In a more particular embodiment of the invention, the signal dye fluoresces upon illumination only when the storage material is in a first state, and does not fluoresce, or fluoresces only weakly, when illuminated when the storage material is in a second state. An up-conversion dye may be Coumarin 6. The storage material may be a fulgide. The fluorescent signal dye may be DODCI. An embodiment of the light-controlled memory includes a light modulator for modulating light beam(s) for writing into, and, when desired, for erasing the memory material. The light modulator may be a spatial light modulator for modulating light beams to form a two-dimensional representation of the data. The spatial light modulator may be one-dimensional (1-D), quasi-one-dimensional (q-1-D), or two-dimensional (2 -D). A lens system focusses the light onto the desired datel(s) at the surface of, or within, the memory material. A dynamic lens system, which may include a zoom lens, may be used to focus on various pages of memory within the body of the memory material. In a particularly advantageous embodiment, focussing is accomplished by a lens system including a microlens array, for simultaneously accessing plural, spaced-apart (sparsed) datels to reduce crosstalk. A translation stage may provide relative motion of the memory material and the light beams. In another embodiment, a light beam in the form of a sheet or highly elliptical beam is used to simultaneously access large numbers of datels.

DESCRIPTION OF THE DRAWINGS

FIG. 6c is a cross-sectional view of the set of light beams of the sparse light beam array produced by the modulator of FIG. 6b, after focussing by a lens array, which beam array is usable with the arrangement of FIG. 6a;

DESCRIPTION OF THE INVENTION

Figure 1:
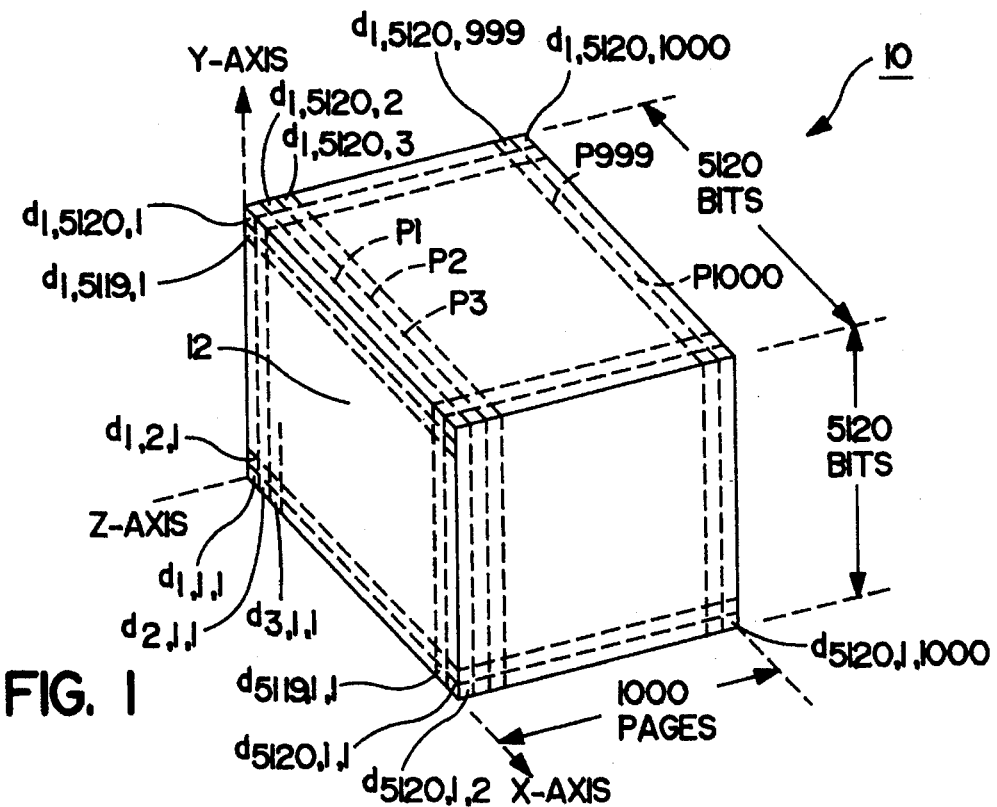
FIG. 1 is a simplified perspective or isometric view of the optical memory block portion of an optical memory in accordance with an aspect of the invention.

FIG. 1 illustrates memory material according to the invention, in the form of a rectangular block or parallelepiped 10 with sides or faces oriented parallel to X, Y and Z axes. As illustrated, block 10 has its "front" face 12 lying in the X-Y plane. Front face 12 is conceptually divided into a 5120-by-5120 element grid, each square element of which represents the smallest storage element which is independently addressable in the X-Y plane for storage of data bits. Also as illustrated in FIG. 1, block 10 is divided parallel to the X-Y plane into 1000 "pages" P1, P2, P3, ... P999, P1000, each of which represents the smallest incremental region in the Z direction in which storage can occur. The intersection of the projection of each grid element with each of pages 1–1000, where the hyphen represents the word "through," defines a rectangular "box" volume memory storage element (a datel), designated $d_{X,Y,Z}$, in which one bit of data may be stored. While the datels of FIG. 1 are identified by dash-line outlines, it should be emphasized that block 10 is a monolithic whole, without identifiable internal boundaries; the datel locations arise due to the method of addressing, described below in conjunction with FIGS. 2a and 2b. The lengths of X, Y and Z sides of block 10 are about one inch, one inch, and in the range between one and four inches, respectively. Naturally, the dimensions may be larger or smaller to increase or decrease the storage capacity. In FIG. 1, elements $d_{1,1,1}$, $d_{2,1,1}$ and $d_{3,1,1}$ are illustrated as being those datels in the first, second and third positions along the X axis, and $d_{5119,1,1}$ and $d_{5120,1,1}$ are the last elements along the X axis. A 5120-by-5120 grid includes more than twenty-six million elements. Also illustrated in FIG. 1 are datels $d_{1,2,1}$, $d_{1,5119,1}$ and $d_{1,5120,1}$, which lie along the Y axis, and datels $d_{1,5120,2}$, $d_{1,5120,999}$ and $d_{1,5120,1000}$. Datels $d_{5120,1,2}$ and $d_{5120,1,100}$ are also identified. Thus, one page of memory block 10 has storage datels sufficient for 5120 times 5120, or 26 Mbits. A memory block such as block 10 of FIG. 1, with 1000 pages, would include $2.62 \times 10^{10}$ datels, corresponding, at 8 bits/byte, to about 3.20 Gbytes of storage capacity. Block 10 of FIG. 1 is made from an optical memory material, described below.

According to an aspect of the invention, the memory material includes a combination of a harmonic generation or up-conversion material which translates light wavelength (frequency), a storage or memory material which changes state in response to the translated light, and a readout material which provides an indication of the state of the storage material at its location. In a particular embodiment of the invention, the memory material is a mixture which includes a frequency up-conversion material such as an up-conversion dye, a photochromic storage material, and a fluorescent material such as a signal dye, which responds to the state of the local or adjacent photochromic material. The active materials may be associated with a carrier such as a polymer. In a more particular embodiment of the invention, the signal dye fluoresces when illuminated only when the storage material is in a first state, and does not fluoresce, or fluoresces weakly, when illuminated when the storage material is in a second state.

The storage component of the memory material is chosen to be a fulgide, for its thermal stability and relatively long data retention. The fulgide changes state in response to ultraviolet (UV) or visible light. The lack of fluorescence of the fulgide is overcome by mixing it with a fluorescent signal dye material, which, upon being addressed for reading, fluoresces only when the fulgide is in a particular state, and not when the fulgide is in another state. The fulgide can have two-photon absorption when exposed to high intensity light, and is otherwise transparent. Usually, two photon absorption peaks at a particular wavelength, which may not match the operating wavelength of a high speed spatial light modulator, described below. This mismatch can limit the overall writing efficiency. The up-conversion dye is added to overcome or ameliorate this limitation. The up-conversion dye has efficient two photon absorption at the operating wavelength of the high speed spatial light modulator, and reemits at a wavelength region which is very efficient for converting fulgide from one state to another, as from a color state to a bleach state. The addition to the up-conversion dye can thus enhance the overall writing efficiency and leads to reduced writing energy. Preferred up-conversion materials are those based on second-harmonic generation or two-photon absorption-induced fluorescence.

Frequency conversion dyes based on two-photon-absorption-induced fluorescence, such as Coumarin 6, can be used to convert infrared light in the 820 to 960 nm regime to visible light in the 550 nm range. The mixture of such a dye with a fulgide allows data writing to be accomplished by irradiating the material with infrared light, whereby the dye converts the infrared light to visible light, to thereby locally write the storage component of the memory material.

Figure 7:
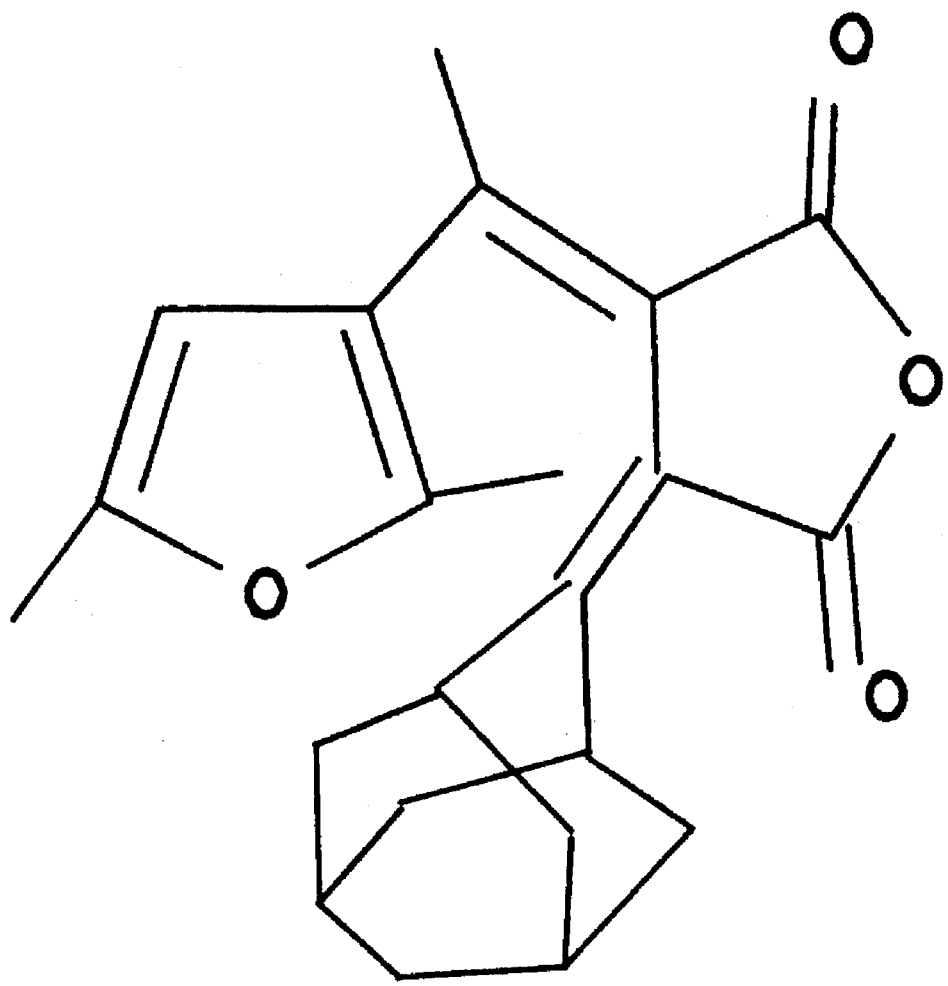
FIG. 7 is a symbolic representation of a photochromic fulgide which may be used in a memory according to the invention.

A first example of a memory material according to the invention includes the photochromic fulgide compound E-Adamantylidene [1-(2,5-dimethyl-3-furyl) ethylidene] succinic anhydride, symbolically illustrated in FIG. 7, mixed with frequency-conversion dye in the form of the above-mentioned Coumarin 6 (CAS No. 38215-36-0, a Kodak optical product supplied by Eastman Fine Chemicals, Eastman Kodak Co., Rochester, N.Y. 14650), and with a signal (READ) dye in the form of 3,3'-diethyloxadicarbocyanine iodide (DODCI), in the preferred proportions described below. The mixture is prepared by dispersal in a carrier of polyvinylbutyral. In an experiment, a 35-μm-thick film of the dispersed material was applied to a glass slide, dried, and exposed to UV radiation at 366 nm, which changed the photochromic material from the colorless form to the colored form. The resulting material, when exposed to a focussed 920 nm laser beam, decreased in color intensity in the exposed area, and resulted in an increase in intensity of the light emitted in the 600 to 700 nm range when later excited by a light at 395 nm. When the exposed area was illuminated with light at 366 nm, the written spot was erased, and the emitted light in the 600 to 700 nm range as a result of illumination at 395 nm decreased.

The proportions of the ingredients of the mixture of the first example, as percentages of the total weight of the substance including the polymer carrier, range from 0.001% to 10% of the photochromic component, with 2.8% preferred, 0.00001% to 1% of the frequency up-conversion dye, with 0.4% preferred, and $10^{-5}$% to 3% of the signal dye component, with 0.8% preferred.

A second example of a memory material is as described above for the first example, substituting polymethylmethacrylate polymer for the polyvinylbutyral.

A third example of a memory material is as described above for the first example, substituting polyvinyl acetate for the polyvinylbutyral.

A fourth example of a memory material is as described above for the first example, substituting urethane acrylate ultraviolet (UV)-curable polymer for the polyvinylbutyral.

A fifth example of a memory material is as described above for the first example, substituting UV-curable epoxy polymer for the polyvinylbutyral.

A sixth example of a memory material is as described above for the first example, substituting 1-(2,5-dimethyl-3-furyl)ethylidene(isopropylidene) succinic anhydride for the photochromic component.

A seventh example of a memory material is as described above for the first example, substituting 2,3-bis(2,4,5-trimethyl-3-thienyl) maleic anhydride for the photochromic component.

An eighth example of a memory material is as described above for the first example, substituting cis-1,2-dicyano-1, 2-bis(2,4,5-trimethyl-3-thienyl)ethene for the photochromic component.

A ninth example of a memory material is as described above for the first example, substituting 1,2-dicyano-1, 2bis(2 -methylbenzothiophene-3-yl)ethene for the photochromic component.

A tenth example of a memory material is as described above for the first example, substituting 2,3-bis(1,2-dimethyl-3-indolyl)maleic anhydride for the photochromic component.

An eleventh example of a memory material is as described above for the first example, substituting 8-hydroxyl-1,3 6-pyrenetrisulfonic acid for the Coumarin-6 component.

A twelfth example of a memory material is as described above for the first example, substituting Nile Red dye (CAS No. 7385-67-3 from Aldrich catalog #29,839-5) for the DODCI component.

A thirteenth example of a memory material is as described above for the first example, substituting Pyridine-1 dye (Kodak CAS No. 87004-02-2, also known as LDS-722) for the DODCI component.

A fourteenth example of a memory material is as described above for the first example, substituting Pyridine-2 dye, available from Exciton, also known as LDS-722, for the DODCI component.

A fifteenth example of a memory material is as described above for the first example, substituting 4-(dicyano methylene)-2-methyl-6 -(p-dimethylamino styryl)-4 H-pyran for the DODCI component.

A sixteenth example of a memory material is as described above for the first example, substituting 2[ 4-(4-dimethylaminophenyl)-1,3-butadienyl] -3-ethylbenzothiazolium p-toluenesulfonate for the DODCI component.

A seventeenth example of a memory material is as described above for the first example, substituting 1,1',3,3, 3',3'-hexamethyl- 4,4',5,5'-dibenzo-2,2',indotricarbocyanine perchlorate for the DODCI component.

An eighteenth example of a memory material was prepared with a slice of lithium iodate ($LiIO_3$) crystal, cut to efficiently double the frequency of a 920 nm laser beam. A thin film was placed on the crystal. The film was of polyvinylbutyral containing the photochromic compound E-Adamantylidene [1-(2,5-dimethyl-3-furyl) ethylidene] succinic anhydride (the same photochromic compound as in the first example) in the colored state, in a mixture with the fluorescent signal dye Pyridene-1. Exposure of the crystal and the thin film to an intense focussed 920 nm laser beam resulted in generation of 460 nm light from the $LiIO_3$ film at the focussed sites, which changed the colored form of the photochromic compound to its colorless form at only those sites, and which resulted, when read by exposure to a beam of light at 395 nm, in emission of light signal at 620–650 nm from the Pyridene-1 component of the memory material.

A nineteenth example of a memory material is as described above for the eighteenth example, substituting potassium dihydrogen phosphate (KDP) or polymethyl methacrylate (PMMA) doped with 2-methyl-4-nitroanylene (MNA), or polymethyl methacrylate (PMMA) doped with para-nitroanilene (p-NA) for the $LiIO_3$ material. The potassium dihydrogen phosphate may be crystalline.

A twentieth example of a memory material includes a lithium iodate crystal as described above in conjunction with the eighteenth example, substituting any of the memory materials of examples one through seventeen for the thin film of example eighteen, with the sole difference that the memory material of the thin film uses E-Adamantylidene [1-(2,5 -dimethyl-3-furyl) ethylidene] succinic anhydride and Pyridene-1.

A twenty-first example of a memory material is as described in any of the examples above, in which the frequency conversion material is a second harmonic generating polymer, such as polymethyl methacrylate (PMMA) doped with a material having a high second order nonlinear hyperpolarizability, such as 2 -methyl-4 nitroanilene (MNA), which, after doping, is poled by an electric field to align the nonlinear moieties.

While the examples given above describe various individual compositions for each function of frequency conversion, memory, and signalling, mixtures of the abovementioned compositions may be used to perform any or all of the functions.

Several approaches have been proposed in the aforementioned Hunter et al. and Esner articles based on two photon absorption processes. One is to write, read, and erase a two-dimensional array simultaneously all through two-photon absorption of short (less than about 10 nsec duration) laser pulses. Such methods can provide high storage density, but have the disadvantage that they require high laser power for reading, writing and erasing. The data transfer rate is limited by the average laser power available. According to an aspect of the invention, the data transfer rates are increased by reducing the average power, which in turn is accomplished by relying upon one-photon absorption for reading. The power for reading is low enough so that it can be provided by a continuous-wave (CW), as opposed to pulsed, source, but of course it will be recognized that the READ light source may be turned ON and OFF as required to perform the function. According to another aspect of the invention, the page to be read is established by control of, or reducing the size of, the memory region illuminated by the READ source. This is possible, because the use of one-photon reading increases the read sensitivity so much, by comparison with two-photon reading, that less written material is required to produce a useful READ signal. This in turn reduces the amount of memory material which must be written, and therefore reduces the total WRITE energy required. The reduction of WRITE energy in turn allows longer WRITE pulses to be generated by the WRITE laser (or other source), or possibly even continuous-wave operation. A further advantage of the reduced amount of memory material which must be written is that fewer molecules of the storage material must change state during any one store/ erase cycle, and if the storage material is subject to fatigue, the molecules available at any one datel site will last for a larger number of cycles.

Figure 2A:
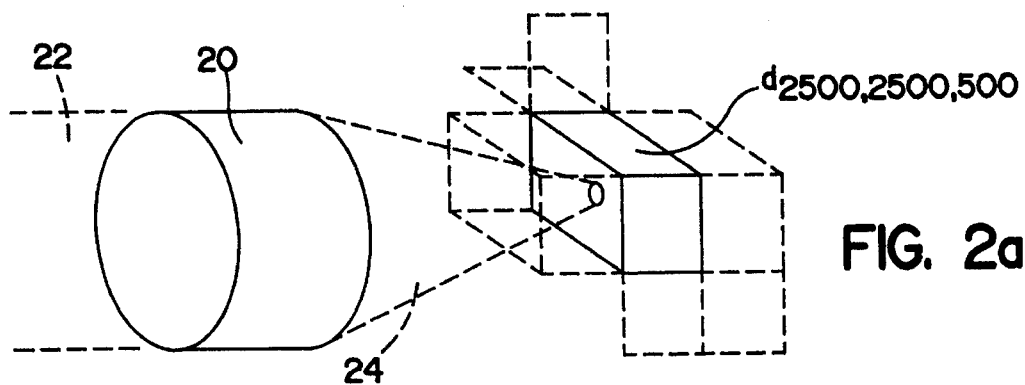
FIG. 2a is a simplified perspective or isometric view of a portion of the block of FIG. 1, illustrating the concept of addressing a particular datel within the block by means of a focussed light beam for writing or erasure.

FIG. 2a shows a simplified block diagram of a portion of block 10 of FIG. 1, illustrating one datel, designated $d_{2500, 2500, 500}$, from which identification the datel may be recognized as being somewhere near the center of block 10. In FIG. 2a, a lens illustrated as a cylindrical object 20 focusses a beam 22 of collimated light to form a converging beam 24, which is focussed at datel $d_{2500,2500,500}$. According to an aspect of the invention, the energy density of the focussed beam is insufficient to result in two-photon absorption in the material at any datel through which the beam passes, except at the focal point in datel $d_{2500,2500,500}$. Thus, a datel located within the body of block 10 of FIG. 1 may be addressed without affecting adjacent datels. The dimensions of a single datel in the x and y directions are established by the intensity of the focussed light beam, by the optical spatial resolution, and possibly by the granularity of the memory material.

Figure 2B:
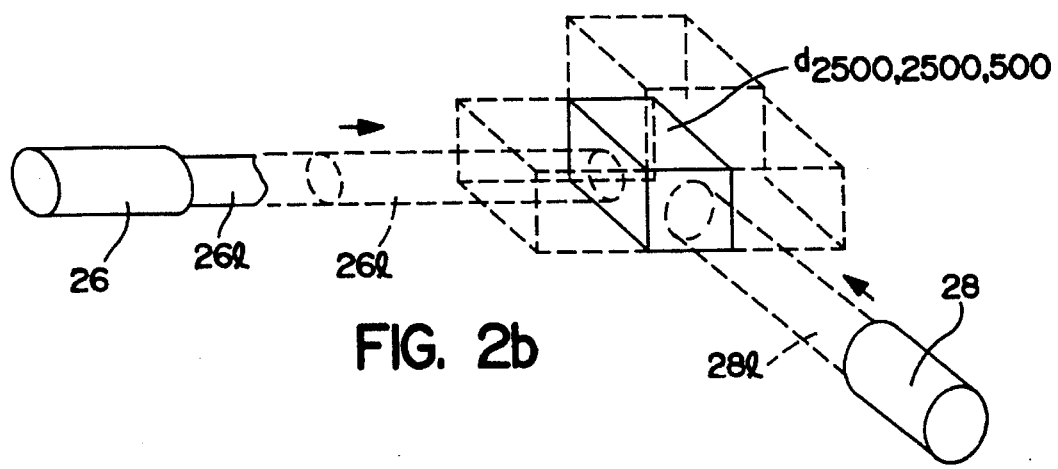
FIG. 2b is similar, illustrating addressing by means of orthogonal illumination (intersecting beams)

FIG. 2b similarly illustrates datel $d_{2500,2500,500}$, illuminated by two intersecting beams of light from two lasers 26 and 28, which produce orthogonal beams of light 261 and 281, respectively. Lasers 26 and 28 each include mirrors and partially-transparent mirrors, as known, which essentially focus the light to form collimated beams 261 and 281. Neither of light beams 26 and 28 alone has sufficient energy density to write the datel, but together they have sufficient energy density at the intersection of beams 26 and 28, which intersection occurs within datel $d_{2500,2500,500}$. Thus, a particular datel within the bulk of memory block 10 of FIG. 1 can be addressed by different illumination arrangements, to the exclusion of other datels, and achieve the required energy density for writing without additional focussing. The beams can also be used for reading, or erasing, if desired. For reading, one of the beams of FIG. 2b, such as beam 281, is used, and as it traverses the line of datels including datel $d_{2500,2500,500}$, it causes those datels which are in the excited state to fluoresce at long wavelength (about 600 to 700 nm), which fluorescence can be detected to identify the current state of the bit stored in the datel. It should be noted that as the beam diameter becomes greater, or the spatial resolution lesser (larger spot), that the minimum dimension that a particular datel may have without crosstalk becomes larger, so that larger beam diameters or poorer spatial resolution reduces the effective data capacity of a particular memory block. It should also be noted that the two beams of light illustrated in FIG. 2b may be at different frequencies.

Reading of written datels may be accomplished by illuminating the cube with a sheet of light, the plane of which is orthogonal to the direction of WRITE beam 20 of FIG. 2a. A sheet or fan-shaped READ beam may be generated by an anamorphic lens such as a cylindrical lens. The sheet of light may traverse block 10 of FIG. 1 from top to bottom, parallel to the X-Y plane. In order to read datels of only one page without reading datels of adjoining pages, the read beam must be tightly focussed in the Z direction over the one-inch by one-inch area of a page, i.e. it must have a focal depth of one inch. However, the size of the focal spot of a lens is directly related to the focal depth, and a large focal depth necessarily results in a large focal spot. This large focal spot, when reading over a large focal depth, requires that the datels be relatively widely spaced in the Z direction, in order to avoid crosstalk among adjacent pixels. For a focal depth of one inch, the READ optics will have a focal spot diameter of about 110 μm, and this becomes the limit on the minimum page thickness.

The dimension in the Z direction of a typical datel, such as datel $d_{2561,2561,500}$ of FIGS. 2a and 2b, thus needs to be larger than, or equal to, the larger of the focal depth of the writing/erasure optics or the focal diameter of the reading optics, in order to avoid crosstalk in writing, erasure, or reading. For an optics to write a 5 μm spot diameter, the focal depth for writing is less than 20 μm. As mentioned above, a reading optics with one-inch focal depth has focal diameter of 110 μm. Therefore the smallest page size that can be used for such a system is 110 μm. Memory block 10 must be about four inches long in the z direction to accommodate 1000 pages. For a constant size memory block, the limitation set by the focal depth thus limits the volume memory density.

Figure 3A:
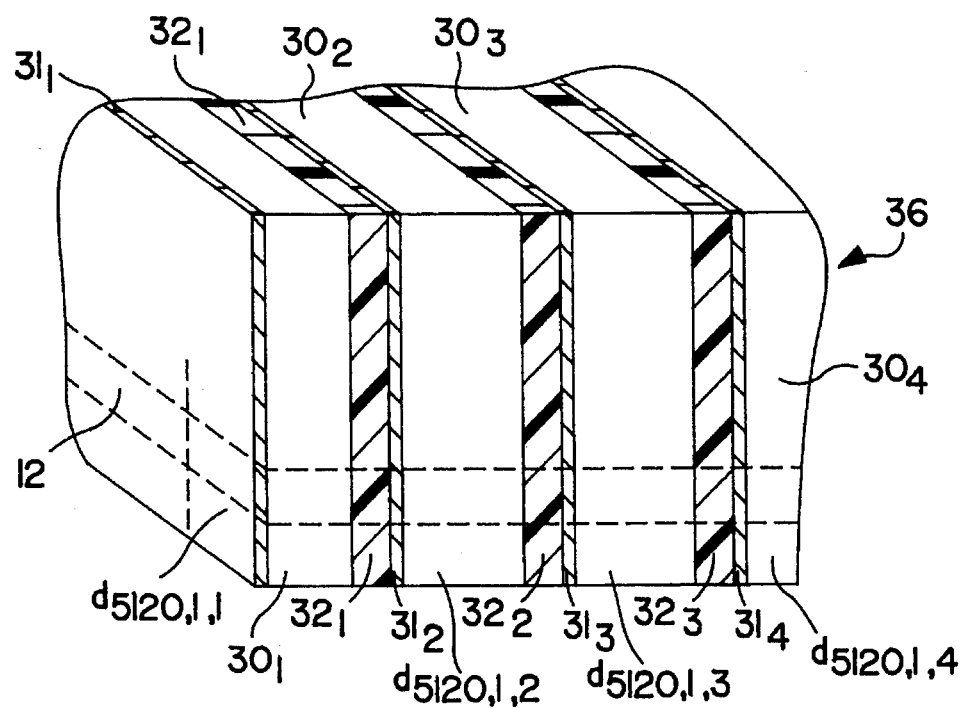
FIG. 3a is a simplified perspective or isometric view of a portion of a memory block similar to that of FIG. 1, with a laminated or layered-sheet construction.

One method to reduce the dimension of the datel $d_{2561, 2561, 500}$ in the Z direction, so that a one-inch-long memory block can accommodate 1000 pages, is to use a laminar structure which includes multiple waveguide layers. FIG. 3a illustrates a corner of a memory block 36 similar in function to block 10 of FIG. 1, but differing in that its construction is laminar, consisting of laminated layers. In FIG. 3a, block 36 includes a plurality of glass plates or lamina 32, such as $32_1$, $32_2$, $32_3$, . . . , each of which has deposited thereon a layer of memory material, according to an aspect of the invention. Thus, glass sheet $32_1$ supports a layer $30_1$ of memory material, glass sheet $32_2$ supports a layer $30_2$ of memory material, glass sheet $32_3$ supports a layer $30_3$ of memory material, and memory material layer $30_4$ is supported on a sheet of glass which is not illustrated in FIG. 3a. Spacer layers, described below, may also be provided. The "back" surface of each sheet of glass 32 is juxtaposed with the "front" surface of the layer of memory material of the next higher page of memory, separated therefrom by inactive "spacer" layers $31_1$, $31_2$, $31_3$ . . . with relatively low index of refraction. This construction creates a laminar arrangement consisting essentially of alternating layers of glass and active material. Each layer of memory material in the arrangement of FIG. 3a constitutes one page of memory block 36. The arrangement of memory block 36 of FIG. 3a has internal boundaries defining each individual page, unlike the arrangement of memory block 10 of FIGS. 1, 2a and 2b, but block 36 has no identifiable boundaries in the X and Y directions within a page. In order to accommodate one thousand such pages within a one-inch square block, each glass-plus-memory-material layer (and spacer layers, if used) must have a thickness not exceeding one mil (0.001 inch). Writing is accomplished in the laminar structure in a manner similar to that described in conjunction with FIGS. 2a and 2b, and the focussed WRITE beam forms a spot which easily fits within the one-mil page thickness.

Reading, and possibly erasure, is accomplished in the arrangement of FIG. 3a by applying the sheet of light to the top of one of the glass layers 32. If an anamorphic lens is used to focus a beam of light onto the edge of each sheet of glass, the spot size can be very small in the Z direction, because the lens needs to focus only onto the edge of the glass, and the depth of focus which is required approaches zero. Each sheet of glass has an index of refraction greater than that of the adjacent memory material, and therefore tends to act as a light waveguide. Light coupled into the upper edge of a sheet of glass, such as sheet $32_2$ of FIG. 3a, will be trapped in sheet $32_2$ by what may be conceived of as multiple reflections at the interfaces between glass sheet $32_2$ and the adjoining layers $30_2$ and $31_3$, and will propagate toward the bottom of the glass sheet.

Figure 3B:
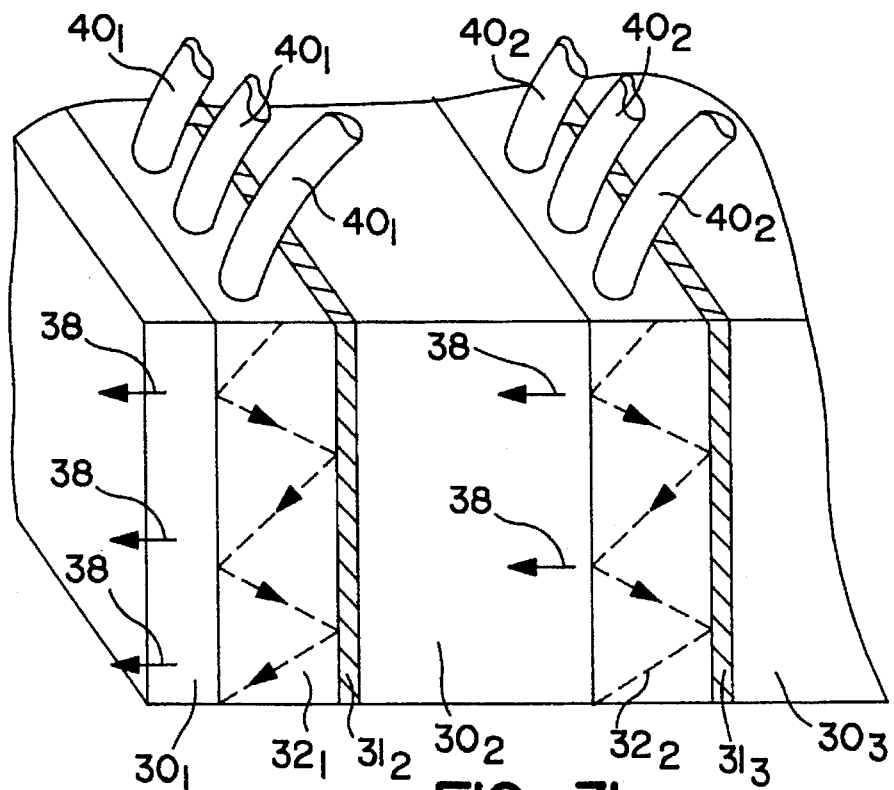
FIG. 3b illustrates an upper edge of the structure of FIG. 3a with light sources in the form of optical fibers coupled to each layer of the structure.

FIG. 3b illustrates a portion of an upper edge of block 36 of FIG. 3a, illustrating another way to couple light into the top of each glass layer 32. FIG. 3b shows a plurality of optical fibers 40 terminating on an edge of each glass sheet 32. For example, a set of four optical fibers $40_{1a}$, $40_{1b}$, $40_{1c}$, and $40_{1d}$ terminates on glass sheet $32_1$, and another set of optical fibers $40_{2a}$, $40_{2b}$, and $40_{2c}$ terminates on glass sheet $32_2$. Each set of optical fibers may originate from an independent source, as for example optical fibers $40_{1a}$, $40_{1b}$, $40_{1c}$, and $40_{1d}$ may all originate from a single star coupler (a multiple-port optical power divider), driven by light from a single controllable source, while optical fibers $40_{2a}$, $40_{2b}$, and $40_{2c}$ originate from a different star coupler, driven by a separate, independently controlled, light source.

In a light waveguide, the electromagnetic fields which carry the light energy are principally constrained within the dielectric medium, but an "evanescent" portion of the fields lie outside the waveguide, and can couple to the memory medium. The light which is coupled to the upper edges of glass sheets 32 in FIG. 3b proceeds downward through the glass sheets, reflecting from the sides as a result of differences between the coefficient of refraction of the glass and the coefficient of refraction of the adjacent material, but coupling some of the light energy into the memory material, as suggested by arrows 38. READ light may be applied to one sheet of glass, such as glass sheet $32_2$, for exciting those datels of memory material of adjacent sheet $30_2$ which are in the written state, and for causing them to fluoresce.

To avoid having READ light applied to a glass sheet, such as sheet $32_2$ of FIG. 3b, illuminate the memory material associated with an adjacent sheet which is not intended to be read, such as sheet $30_3$ of memory material, each layer of memory material 30 underlies a layer 31 of spacer material, such as layer of polymer or other material with an index of refraction lower than that of the glass. Thus, layer $30_1$ of memory material of FIG. 3a underlies a spacer layer $31_1$, layer $30_2$ of memory material (FIGS. 3a and 3b) underlies a spacer layer $31_2$, and layer $30_3$ of memory material underlies a spacer layer $31_3$. When each glass sheet $32_1$, $32_2$, $32_3$ . . . with its deposited layers of memory material $30_1$, $300_2$, $30_3$ . . . and spacer $31_1$, $31_2$, $31_3$ . . . are stacked together or juxtaposed, each glass sheet 32 is in each case (except the last layer) juxtaposed with a spacer layer 31. The spacer layers interact with the relatively high index of refraction of the glass layers in a fashion well known to those familiar with dielectric waveguides, to limit the reading/erasure light to interact with only one memory layer. Because the evanescent light intensities decay exponentially inside the layers $31_3$ and $30_2$ away from the interfaces, the intensity of the electromagnetic fields decay in the spacer layers 31 to a level below the intensity required to produce a significant READ signal, while having sufficient amplitude within the active memory material to produce fluorescence. As a result, the light propagating in any glass sheet 30 as illustrated in FIG. 3b reaches only its associated layer 30 of memory material, and is preferentially rejected by the adjacent spacer layers 31. In this fashion, each layer of glass of the laminar block 36 of FIGS. 3a and 3b, and its adjacent memory material, may be independently illuminated with light for any purpose. In a particular embodiment, light applied in this manner is used for reading, because all the datels associated with (adjacent to) a particular layer of glass may be addressed simultaneously by light applied along the edge of the block as described in conjunction with FIG. 3b, and a selected one of those datels may be simultaneously illuminated by a focussed or collimated light beam as described in conjunction with FIGS. 2a and 2b, to thereby illuminate the selected one datel with a maximum intensity of light, andor with light of different colors.

Ideally, the difference between the coefficients of refraction of the glass and the spacer layers would be about 0.01, which would correspond with a reflection of the WRITE beam at each layer of the laminar structure of magnitude $10^{-4}$, whereupon the loss of the WRITE beam traversing 1000 layers would be about 0.1. In a particular experimental embodiment of a laminated block with glass sheets 140 μm thick, and having coefficient of refraction $^n$= 1.515, and with the coefficient of refraction of the memory material according to the first example being $^n$=1.47, certain datels were written. Light was then propagated as a "sheet" through a glass sheet of a page of memory, generally as described above. The emitted light from written datels was observed as fluorescence in the 600 to 700 nm range at the datel location while looking in the Z direction through the material.

Figure 4:
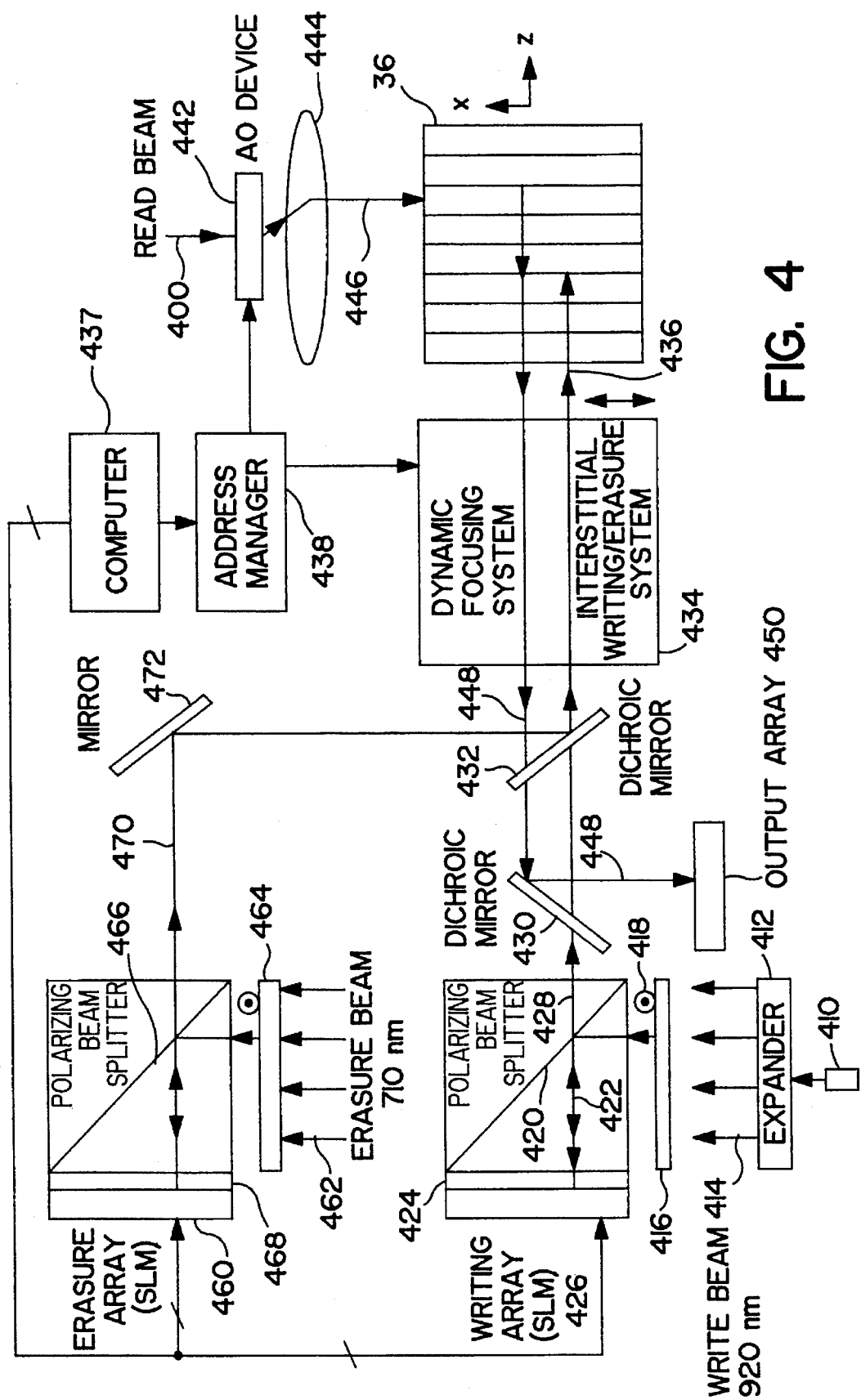
FIG. 4 is a simplified block diagram of a memory system according to the invention.

FIG. 4 is a simplified block diagram of a memory system according to the invention, in which the memory is a laminated block similar to memory block 36 of FIGS. 3a and 3b, and is identified by the same designation. The memory material is the composition described above in conjunction with example 1, with the above described preferred relative amounts of the three active components. In FIG. 4, a light source such as a laser 410 applies an infrared WRITE beam at 920 nm to a beam expander 412, which expands the beam to produce an expanded, collimated light beam 414. Expanded light beam 414 is passed through a polarizing filter 416 to polarize the light in the direction illustrated by arrow 418. From filter 416, the WRITE beam enters a polarized beam splitter 420, and is reflected to the left, and through a quarter-wave plate 424 for polarization rotation, to a spatial light modulator (SLM) 426. Modulator 426 includes as many controlled modulation pixels as there are datels in a page of memory 36, if an entire page is to be written simultaneously, or a lesser number depending on the selected array size of data to be stored simultaneously. If the selected array size is smaller than the size of a page, defined here as a 5120×5120 size, the selected size is termed a "paragraph". For example, a paragraph can have a size of 512×512, in which case a page will contain 100 paragraphs, as described in more detail below. A preferred spatial light modulator is a 2D GaAs SLM with a high-speed response of 100 MHz or greater; a preferred modulator is described in copending patent application Ser. No. 08/109,550, filed Aug. 20, 1993 in the name of Worchesky et al. The pixels of modulator 426 which correspond to datels of memory 36 which are to be written are set for reflection of light, and those pixels which correspond to datels which are not to be written are set for absorption. The modulator is controlled, for example, by the write control portion of a computer 437 or processor with which the memory arrangement of FIG. 4 is associated. Thus, the WRITE beam as reflected from SLM 426 is spatially modulated to correspond to the relative spatial locations of the datels of memory 36 which are to be written on one paragraph or page. The modulated WRITE light beam 428 is reflected from SLM 426, back through quarter-wave plate 424 to complete its polarization rotation, and through polarized beam splitter 420. From beam splitter 420, WRITE light beam 428 passes through dichroic (frequency-sensitive) mirrors 430 and 432 to a dynamic focussing system illustrated as a block 434. Dynamic focussing system 434, under the control of an address control block 438 responsive to computer 437, focusses the WRITE beam at an image plane coincident with one page of memory 36. The focussed WRITE beam is illustrated as 436 in FIG. 4. Thus, each pixel of the WRITE beam is simultaneously focussed on its respective datel in the memory material, and all the datels in the particular paragraph or page are written simultaneously. The material of memory 36 is transparent to the 920 nm light, so the light can be focussed at any page within the block.

The bright 920 nm spots focussed within the datels of a particular page of memory 36 by focussing system 434 of FIG. 4 are smaller than the dimensions of the datels, so crosstalk among adjacent datels is not expected due to the focussed spot. Another type of crosstalk is described below in conjunction with FIG. 5. At the focus, each of the bright spots reaches an intensity sufficiently great so that instead of being transparent, the Coumarin 6 dye absorbs the light by two-photon absorption, and re-radiates visible light in the 500 to 550 nm range. The reradiated light is absorbed locally, within the confines of the datel, by the photochromic fulgide material, which converts to its colored state. Thus, the writing operation changes the state of the photochromic material, in effect changing it from a logic "0" to a logic "1" at the particular datel. As mentioned, all the datels of a page can be written simultaneously to any pattern of ones and zeroes. In the written state, the photochromic material continues to be transparent to the 920 nm radiation, so the writing of one page does not prevent pages more remote from focussing system 434 ("behind" the written page as viewed from the light source) from being written.

Figure 5:
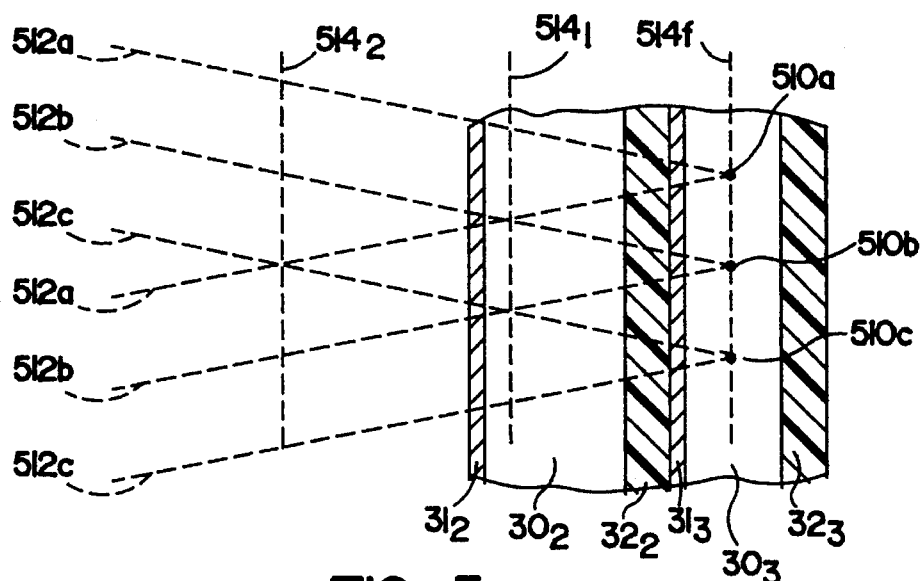
FIG. 5 is a cross-sectional elevation view of a portion of the block of FIGS. 3a and 3b, illustrating overlap of adjacent focussed beams.

While crosstalk among adjacent datels due to the focussed spot is not expected, there is another potential source of crosstalk. FIG. 5 illustrates a portion of a laminated memory block, similar to that of FIG. 3a, together with simultaneously-occurring WRITE beams at 920 nm, such as those described in conjunction with FIG. 4. In FIG. 5, three mutually adjacent datels are being written by light focussed at spots 510a, 510b, and 510c in memory layer $30_3$. The spots are smaller than the dimensions of the datels in which they occur, so no crosstalk occurs among the datels of layer $30_3$. The light beams associated with focussed spots 510a, 510b and 510c are indicated by their outlines, and are designated 512a, 512b and 512c, respectively. While the focus of each beam 512 at 920 nm causes the power density at its corresponding focussed spot 510 to rise to a level at which the desired nonlinear effect of two-photon absorption and 550 nm radiation to occur, the power density also rises in adjacent memory layer $30_2$ due to the overlap of the beam. Beams 512a, 512b and 512c do not overlap between the focal plane 514f and another plane $514_1$. Beams 512a and 512b overlap, and beams 512b and 512c overlap, between planes $514_1$ and $514_2$, and all three beams overlap to the left of plane $514_2$. The power density at any cross-section of a beam 512 decreases in proportion to the square of the distance of the cross-section from the focal point 510, so the power density of the beams at large distances from focal point 510 is expected to be very low. Near the focal point, however, the overlap of adjacent beams may result in achieving sufficient power density for two-photon absorption, with the result that crosstalk may occur among datels of adjacent pages. If beams 512 of FIG. 5 are 920 nm WRITE beams, writing may undesirably occur at corresponding datels of pages of memory other than the desired page.

According to another aspect of the invention, a sparse light pattern is used, to move the beam overlap locations to such a large distance from the focal points that the power densities of the beams are too low to affect the memory material except at the focal points. This is accomplished by writing mutually adjacent datels only during different writing intervals, so that beams are never simultaneously focussed on mutually adjacent datels of one page. As a result, the beam overlap is moved to a more remote location. This may be understood by referring to FIG. 5, and imagining that beam 512b is eliminated, so that only beams 512a and 512c are present, focussed on semi-adjacent spots 510a and 510c, respectively. In such a circumstance, the first beam overlap would be the overlap occurring at plane $514_2$, more distant from focal plane 514f than plane $514_1$. As a result of the increased distance of the first beam overlap from the focal plane with sparse beams, the power density at the overlap is significantly reduced, thereby reducing the likelihood of unwanted interaction and the resulting undesired crosstalk. By extension of the above method, simultaneous beams might be focussed only on spots separated by two, five, ten or more datels, thereby moving the light beam overlaps to very large distances from the focal plane, at which distances the beam power densities are so low that, even when overlapped, the beams cannot cause an interaction with the memory material so as to create crosstalk.

Figure 6B:
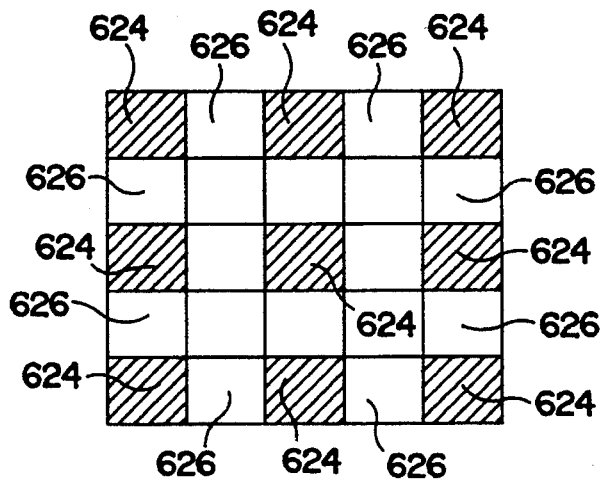
FIG. 6b is a frontal view of a spatial light modulator arranged for modulating a of sparse light beam array.
Figure 6C:
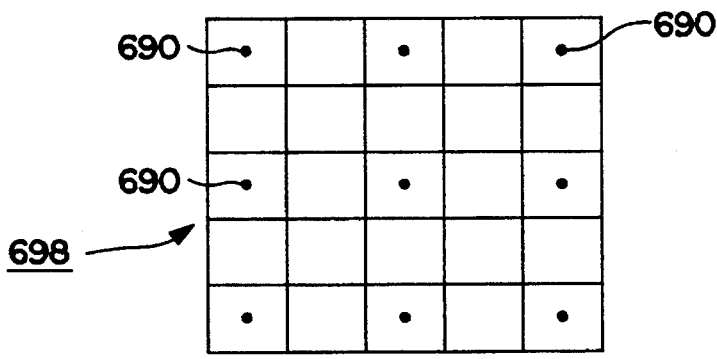
Figure 6A:
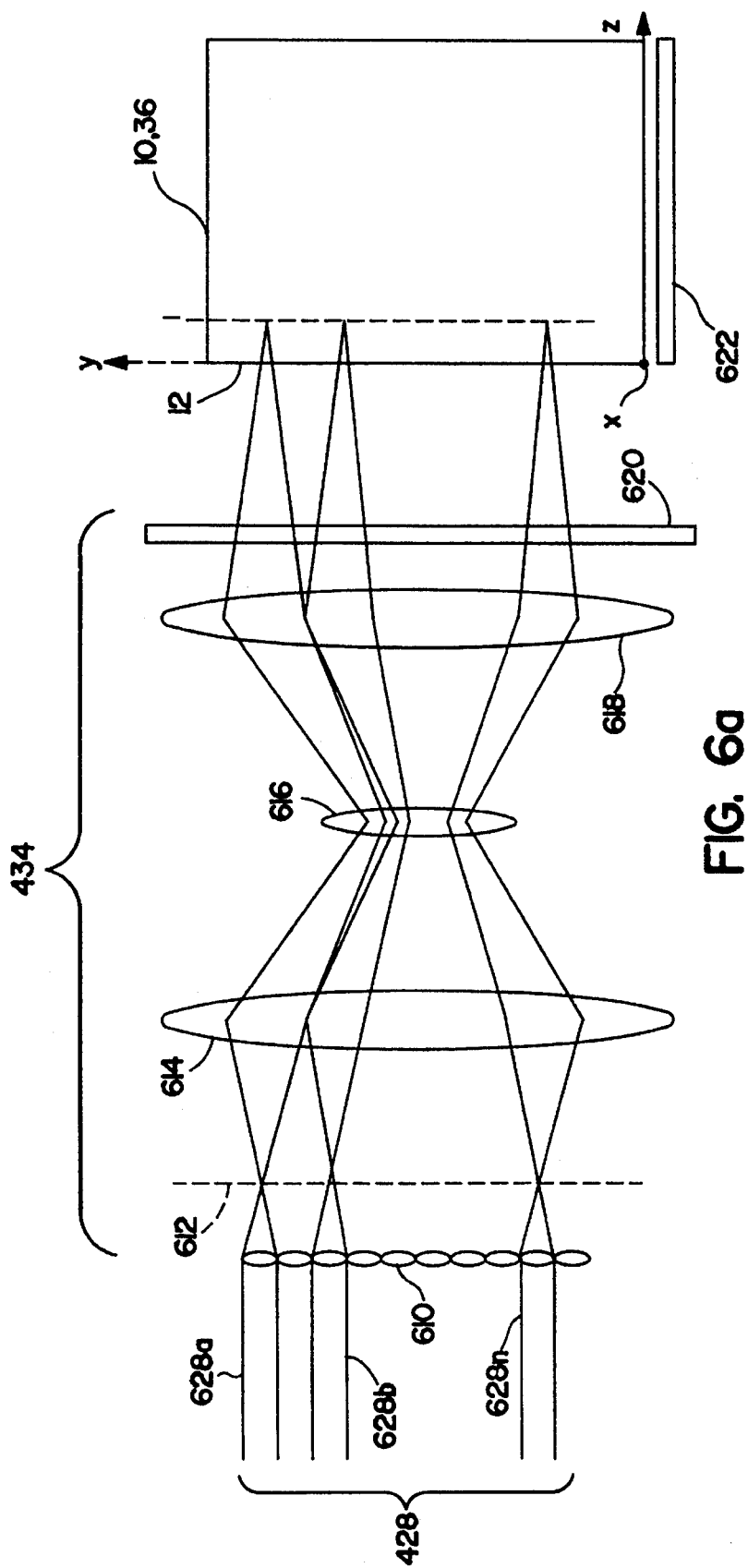
FIG. 6a is a schematic diagram of a datel addressing scheme which simultaneously addresses non-adjacent datels in a sparse manner.

According to a further aspect of the invention, the sparse light pattern is used in conjunction with physical translation of the memory block relative to the light beams, to thereby allow all datels to be accessed by a WRITE beam. FIG. 6a illustrates an arrangement of sparse beams interacting with a memory block. In FIG. 6a, elements corresponding to those of FIG. 4 are designated by like reference numerals. In FIG. 6a, WRITE beam 428 consists of spaced-apart beams 623a, 628b, . . . , 628n, generated by a spatial light modulator, such as modulator 426 of FIG. 4, having an active region pattern such as that illustrated in FIG. 6b. In FIG. 6b, the active modulating regions are illustrated as hatched regions 624, spaced from each other by absorbent regions 626. Thus, only non-adjoining modulated beams 628a, 628b, . . . , 628n (FIG. 6c) are produced. Of course, the active regions 624 illustrated in FIG. 6b may be spaced apart by two, three, five, ten or more inactive regions, depending upon how sparse the beams are to be. Nonadjacent modulated beams 628a, 628b, . . . , 628n of WRITE beam 428 of FIG. 6a are applied to a microlens array 610, which focuses at a focal plane 612. WRITE beam 428 of FIG. 6a is patterned by spatial light modulator 426 of FIG. 4. The pattern is focussed by a 2-D microlens array 610 of FIG. 6a. Each lens or lenslet of microlens array 610 has a diameter matching the pixel size of SLM 426 of FIG. 4. The focussed spot size is smaller than the size of a lens element of microlens array 610. Therefore, a pattern is created at a plane 612 which corresponds with that shown in FIG. 6c with the bright spots 690, if any, which are generated by the current state of modulator 426, appearing at the centers of the elements of an "invisible" lattice designated 698. The side of one cell of the lattice equals the size of one element of the microlens array. Any bright spot 690 in the lattice will be separated from another bright spot in both x and y directions by at least the diameter of a microlens element. A focussing relay lens 614 couples the sparse beams to an electrooptic or mechanical zoom lens 616, which ultimately adjusts the focal depth of the beams within memory block 10, 36 but causes the beams to diverge. The same pattern of light and dark focal spots is then reimaged inside the memory block by lens 618. The size of the imaged focal spots within the memory material is selected to be about ½ of the datel dimension in the X, Y, and Z directions. At the focal plane, imaged bright spots, if any, are separated from other spots by a multiple of the datel dimensions in both the x and y directions. The multiple can be one, as suggested by FIGS. 6b and 6c, or the multiple can be two, three, ten or more, depending how sparse the beams are designed. Thus, no adjacent datel will be written simultaneously. As so far described, writing may be accomplished at sparse locations at any page within the memory. If spatial light modulator 426 of FIG. 4 is a 5120×5120 array, to correspond with the datel locations illustrated in FIG. 1, but the modulator active surface is sparse by a factor of, for example, ten, so that the active portion is 512×512 elements, the active 512×512 portion is termed a paragraph, as described above, and there would be, in the case of the example, $10^2$=100 paragraphs per page. Access to the different paragraph locations is achieved by a mechanical X-Y translation stage 622, coupled to memory block 10, 36, which translates by an integer number of datels, to bring different paragraphs of memory block 10, 36 under the sparse beam (interstitial writing). The displacement in x or y direction may be 5 μm per steps for 10 steps in each direction. Use of a piezoelectrically driven translation stage can result in a less than 30 μsec access time between paragraphs. Thus, all portions of the memory can be written, by selecting the appropriate paragraphs by translation by means of stage 622. As an alternative to translation stage 622, the interstitial writing can be achieved by tilting a transparent 2 mm parallel plate 620 in a step of about 0.2° around the x, y, or both axes to provide x or y motion of the focussed beams, or to displace the image to any desired interstitial location.

Reading is accomplished by applying a "sheet" of light to the glass sheet associated with one layer or page of memory 36 of FIG. 4, under the control of address block 438, which is ultimately under control of the memory read-write portion of the associated computer. In FIG. 4, a read beam 400 at about 400 nm is applied to an acoustooptic (AO) device illustrated as a block 442, together with additional control signals, if necessary, for scanning the read beam from page to page of the memory, and the resulting beam is spread along the upper edge of the glass sheet of the appropriate page by a spreading device illustrated as a cylindrical lens 444 for creating a highly elliptical beam, the major axis of which is parallel to one of the glass layers of the memory, for being coupled thereinto. Coupling of read light could also be accomplished by a system of optical fibers and star couplers as described in conjunction with FIGS. 3a and 3b. While the memory material has a moderate absorption cross-section at 400 nm, the transparent glass guiding layer carries the read light deep into the cube as described in conjunction with FIG. 3b. The 400 nm light is absorbed by the DODCI component of the memory material, which fluoresces at a wavelength longer than 615 nm only from locations at which the logic one state is stored, and not from locations at which a logic zero state is stored. Thus, a region adjacent to the glass sheet fluoresces to provide an indication of the state of the memory material. Because of the evanescent decay of the 395 nm read beam light in the memory material and in the spacer, pages of memory remote from the sheet of glass associated with the page being read do not receive sufficient light to fluoresce. The fluorescing signal dye material produces light at a wavelength longer than 615 nm, to which the memory material is transparent. The fluorescence of the DODCI or other signal dye at or near the focal plane is picked up by focussing system 434, and formed into a collimated beam 448, which passes through dichroic mirror 432, and reflects from dichroic mirror 430, to direct the collimated light beam through an array of pinholes onto an output array 450 of photodetectors. The array of pinholes has a sparse pattern to match the format of the light array created at the plane 612 of FIG. 6a. More particularly, each pinhole is located at the center of a cell of the invisible sparse lattice. The diameter of each pinhole is much smaller than the size of the corresponding cell. The collected light beam will form an image at the plane where the pinholes locate. Only those passing through the pinholes will are reimaged by the pinholes, to produce a diverging beam from each pinhole which is illuminated by the sparse pattern. The diverging beam from each pinhole intercepts a photodetector in the plane of the array of photodetectors. Array 450 includes one location or pixel for each datel of one paragraph or page of memory 36. Light beam 448 is sensed by array 450, and only those pixels respond which are associated with fluorescing ones of the datels of memory 36, which means that the pixels of detector array 450 which respond are those which receive fluorescent light from datels of memory 36 at which a logic one was stored. Since datels of memory 36 at which a logic zero was stored do not fluoresce when illuminated by a read beam, those pixels of detector array 450 which correspond to the zero-storing datels do not respond. Thus, the pattern of ones and zeroes stored in one paragraph of one page of memory 36 is replicated on detector array 450 when the whole paragraph or page is addressed by a read beam. Array 450 may be, for example, a CCD photosensor array, well known in the television art. The image-representative signals may be read in a conventional manner with a parallel output signal bus, and coupled to a utilization apparatus such as a computer.

As mentioned above, the use of one-photon absorption signal dye, such as DODCI, for reading, reduces the power requirements of the READ light source or laser, and because the one-photon material is more efficient in producing fluorescence, reduces the amount of memory material which must be written in order to produce a discernible READ signal. The reduced requirement for written material also reduces the power requirements of the WRITE and ERASE light sources. An analysis of system power requirements of 2-D read, write and erase systems which use two-photon absorption processes exclusively suggests that such systems require high power, short-pulse lasers for reading, whereas the systems of the invention require significantly less laser power, which may be available from a CW laser. Also, the inventive systems appear to require about one-tenth the pulsed power for writing and erasure, and one-third the reading power. The reduced power requirements of the system according to the invention at least allows a greater pulse repetition rate for reading and writing by comparison with exclusively-two-photon-absorption, so that an improvement of data transfer rate by a factor of 10 is anticipated.

As mentioned, one of the advantages of the use of fulgides as memory materials is that they are relatively stable, and can maintain the written state for years at room temperature. However, erasure may often be desired in ordinary operation of a data memory. In the arrangement of FIG. 4, erasure is accomplished by applying an intense beam of light at 710 nm to the datels to be erased. More specifically, the computer selects those datels which are to be erased at each page or current paragraph of the current paragraph or page, if applicable, of memory. For each page (or paragraph thereof), those pixels of a spatial light modulator 460 corresponding to the datels to be erased in the current paragraph or page are set to a reflective condition. A collimated, unmodulated ERASE light beam, illustrated as 462, is applied through a polarizing filter 463, and the polarized light reflects from a polarized beam splitter 464, and passes through a quarter-wave plate, generally as described above in relation to the WRITE beam. Portions of the ERASE beam arriving at spatial light modulator 460 are reflected, and the reflected portions, corresponding to the datels to be erased, pass once again through the quarter wave plate, and through beam splitter 466, to form a modulated ERASE beam designated 470. ERASE beam 470 is reflected by mirror 472, and by dichroic mirror 432, to pass through focussing system 434. The memory material is transparent to the 710 nm light, so it can reach any location within block 36. The photochromic component of the memory material absorbs the focussed 710 nm light at the focal plane through a two-photon process, and switches to its ground state. Thus, the memory material can be erased. Those datels of memory which lie within one page of memory, and which are to be erased, can be erased simultaneously.

Figures 8, 9A, 9B, 9C, 9D, 9E:
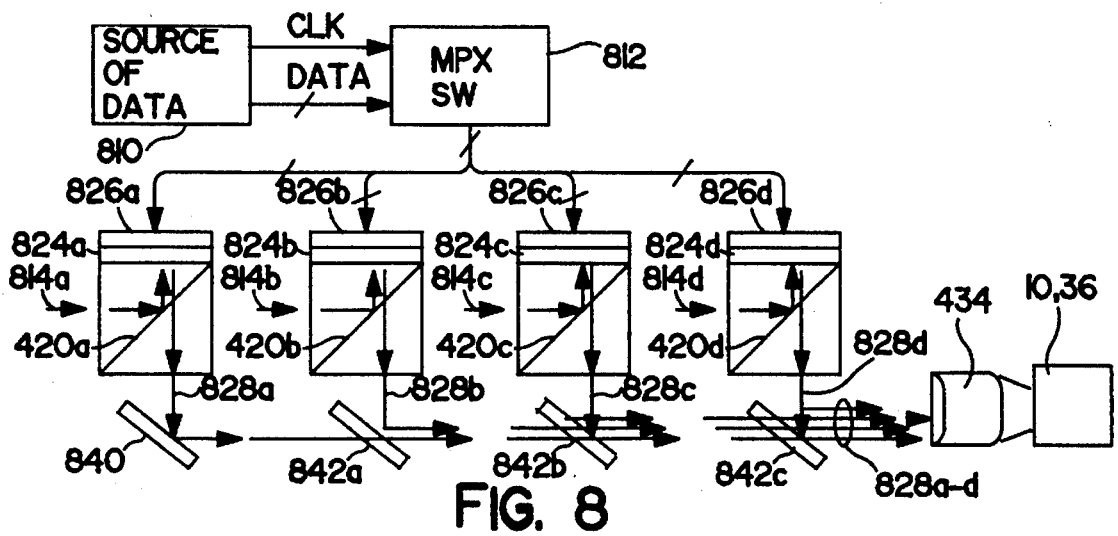
FIG. 8 is a schematic block diagram of an electronic sparse addressing system.
FIGS. 9a–9e are frontal views of various spatial light modulators useful in the arrangement of FIG. 8.

It may be desirable to operate the memory arrangement without mechanical translation of the memory block or the light beam source. In FIG. 8, a source of data 810 produces parallel data to be stored, together with clock and timing signals, which are applied to a one-of-four multiplexer 812. One-of-four multiplexer 812 accepts the parallel data to be stored, and routes the first set of data (one paragraph) to a spatial light modulator (SLM) 826a. Light modulator 826a is associated with a polarized beam splitter 420a and a quarter-wave plate 824a for modulating an unmodulated collimated, polarized WRITE beam 814a, to produce a modulated output beam 828a. FIG. 9a illustrates a portion of the face of spatial light modulator 826a, identifying the active elements by the numeral "1". Each active element modulates one bit of the data to be stored. The row and column locations of the active elements are identified by roman numerals and capital letters, respectively. As illustrated, the active elements of SLM 826a are IA, IE, IIC, IIIA, IIIE, IVC . . . The other elements of SLM 826a are absorptive, and do not modulate the beam. One-of-four multiplexer 812 routes the second set of data from source 810 of FIG. 8 to an SLM 826b, which is associated with a polarized beam splitter 420b, and a quarter-wave plate 824b for modulating an unmodulated WRITE beam 814b, to produce a modulated output light beam 828b. FIG. 9b illustrates a portion of the face of SLM 826b, corresponding to the portion of SLM 826a illustrated in FIG. 9a, with the active elements designated by the numeral "2". The third and fourth sets of data from source of data 812 of FIG. 8 are routed to SLMs 826c and 826d, which are associated with quarter-wave plates 824c and *d* and polarized beam splitters 420c and 420d as described above, for modulating beams 814c and 814d, respectively. The unmarked elements are absorptive. FIGS. 9c and 9d represent by the numerals "3" and "4", respectively, the active elements of the illustrated portion of the faces of SLMs 826c and 826d, respectively.

As illustrated in FIGS. 9a–9d, no numeral is adjacent a like numeral, so at any one time, the modulation is sparse.

Referring to FIG. 8, a mirror 840 reflects modulated light beam 828a toward half-silvered mirror 842a, where light beam 828a would combine with beam 828b, if both existed simultaneously. The "two" beams proceed toward half-silvered mirror 842b, where they "combine" with beam 828c. All the beams are "combined" together by half-mirror 842c. When properly aligned so that the elements are in registry, the beams generated by the various active elements are interspersed, as illustrated in FIG. 9e. The interspersed beams are applied through a dynamic focus arrangement 434 similar to that described above, for focussing into memory block 10 or 36. To reduce loss, polarized beam combiners could be used instead of half-silvered mirrors.

In operation of the arrangement of FIG. 8, the combined WRITE beam is sequentially modulated by the patterns of FIGS. 9a, 9b, 9c and 9d. Therefore, the focussed light beams within the memory block are at all times spaced apart, but writing to the various locations of different paragraphs is accomplished without physical translation of the memory block.

If the combination of a plurality of modulators as illustrated in FIG. 8 is insufficient in combination to write one entire page of memory, as for example if each of the four SLMs 726a–d is a 502×502 modulator, and a page as 5020×5020 datels, the electronic sparse writing scheme may be used in combination with a translation arrangement, with the advantage of reducing the number of translations per unit time, and increasing the minimum step size.

The arrangement of four discrete SLMs arranged as in FIG. 8 may be viewed as a single SLM, in which all elements are active as in FIG. 9e, but in which the data is applied to different sets (sets 1, 2, 3 4) of the elements, and the other elements remain in their absorptive state. Thus, a simple large SLM may be used, in which all elements are active, but which are sequentially enabled in a sparse manner, as suggested by FIG. 9e. When a large number of inactive modulator elements separate the active elements, a very large number of possible sparsing patterns exist.

Figure 10A:
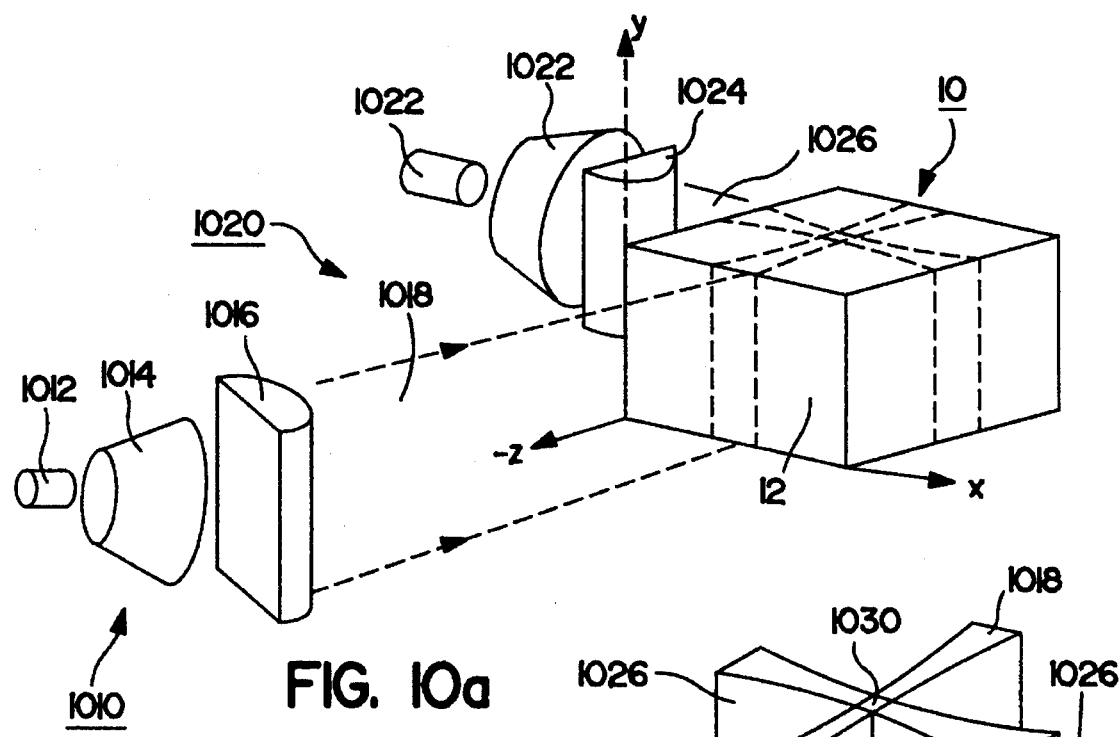
FIG. 10a is a simplified perspective or isometric view of a memory block and a pair of orthogonal WRITE light generators aiding in understanding another embodiment of the invention.

FIG. 10a is a simplified perspective or isometric view useful in explaining another embodiment of the invention. In FIG. 10a, a block 10 of optical memory material, which may be a block using the fulgide and signal dye compositions described above, but without the upconversion dye, is associated with a first WRITE light projector 1010, which includes a source of light 1012, a beam expander 1014, if necessary, and a cylindrical lens 1016 for shaping the expanded light into a thin sheet of light or "fan" shaped beam 1018, elongated in the Y direction, which impinges on face 12 of memory block 10. The plane of sheet beam 1018 is parallel to the YZ plane. A second WRITE light projector 1020 includes a source 1022 of light, a beam expander if necessary, and a cylindrical lens 1026, for shaping the light from source 1022 into a thin fan beam 1026, elongated in the Y direction, impinging upon block 10 at a face orthogonal to face 12. The sheet of light beam 1026 lies parallel to the XY plane. Fan beams 1018 and 1026 intersect within the block along a vertically disposed (parallel to the Y axis) line or column, illustrated as 1030 in FIG. 10b and in the top view of FIG. 10c. With the arrangement of FIGS. 10a, 10b, and 10c, a vertical column of memory material may be written simultaneously, with the transverse dimensions of the column being established by the dimensions of the intersection of the beams. The two fan beams will tend to have relatively large transverse or lateral dimensions near the cylindrical lens by which they are focussed, and also far from the focal point, as suggested by the shape of beams 1018 and 1026 in FIGS. 10b and 10c, with a narrow or focussed region (a waist) at moderate distances from the cylindrical lens. The two beams are made to intersect at a location such as 1030 near the focus of the beams, to reduce the size of the column of datels which is ultimately written at the beam intersection. The beam intersection will have finite dimensions, but writing does not take place at any location within the memory block, except at the intersection, because that is the only location at which the beam intensity is high enough to cause the nonlinear interactions which result in writing. The memory material may be a two-photon absorbing material, such as those described above. The two beams may be at different frequencies, such as 1300 nm and at 890 nm, for writing to the abovementioned fulgide materials, but the frequencies may of course be selected for the particular material being used.

Figure 10B:
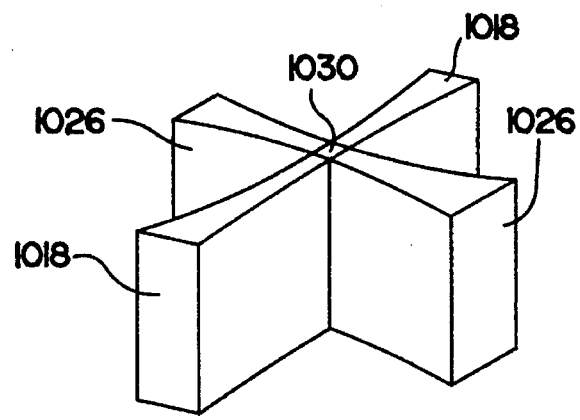
FIG. 10b is a perspective or isometric view of the intersecting light beams within the memory block of FIG. 10a, and FIG. 10c is a plan view of the block of FIG. 10a, illustrating the intersecting light beams.
Figure 10C:
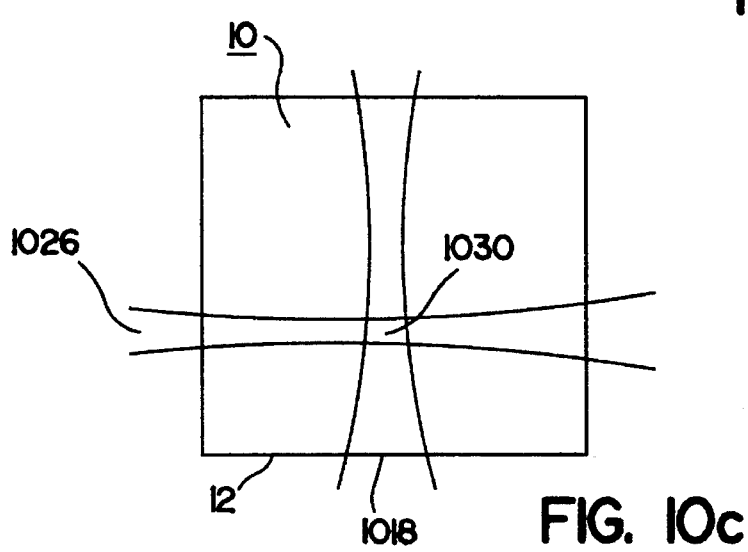

As so far described, the arrangement of FIGS. 10a, 10b, and 10c is capable of writing only to a narrow cylindrical volume (1030 of FIGS. 10b and 10c) vertically disposed (parallel to the Y axis) in the memory material. If, however, light source 1012 of FIG. 10a includes a modulator, individual datels may be simultaneously written into a particular column. Recognizing that the memory material contains no internal boundaries, it is useful to identify locations by their column, and by the "floor" or "story" in that column. If, for example, WRITE light source 1012 of FIG. 10a includes a column light modulator, such as a vertical 1×1024 pixel array, with one pixel above another, as many as 1024 pixels could be simultaneously written at different vertically disposed stories in column volume 1030 of FIGS. 10b and 10c. Each story, in that instance, would contain one datel. Thus, a "paragraph" as described in conjunction with the arrangement of FIG. 4 corresponds, in the embodiment of FIG. 10a, to a column. The lateral dimensions of the column are expected to be sufficiently large so that writing single datels into each story would be wasteful of useful memory material.

Figure 11:
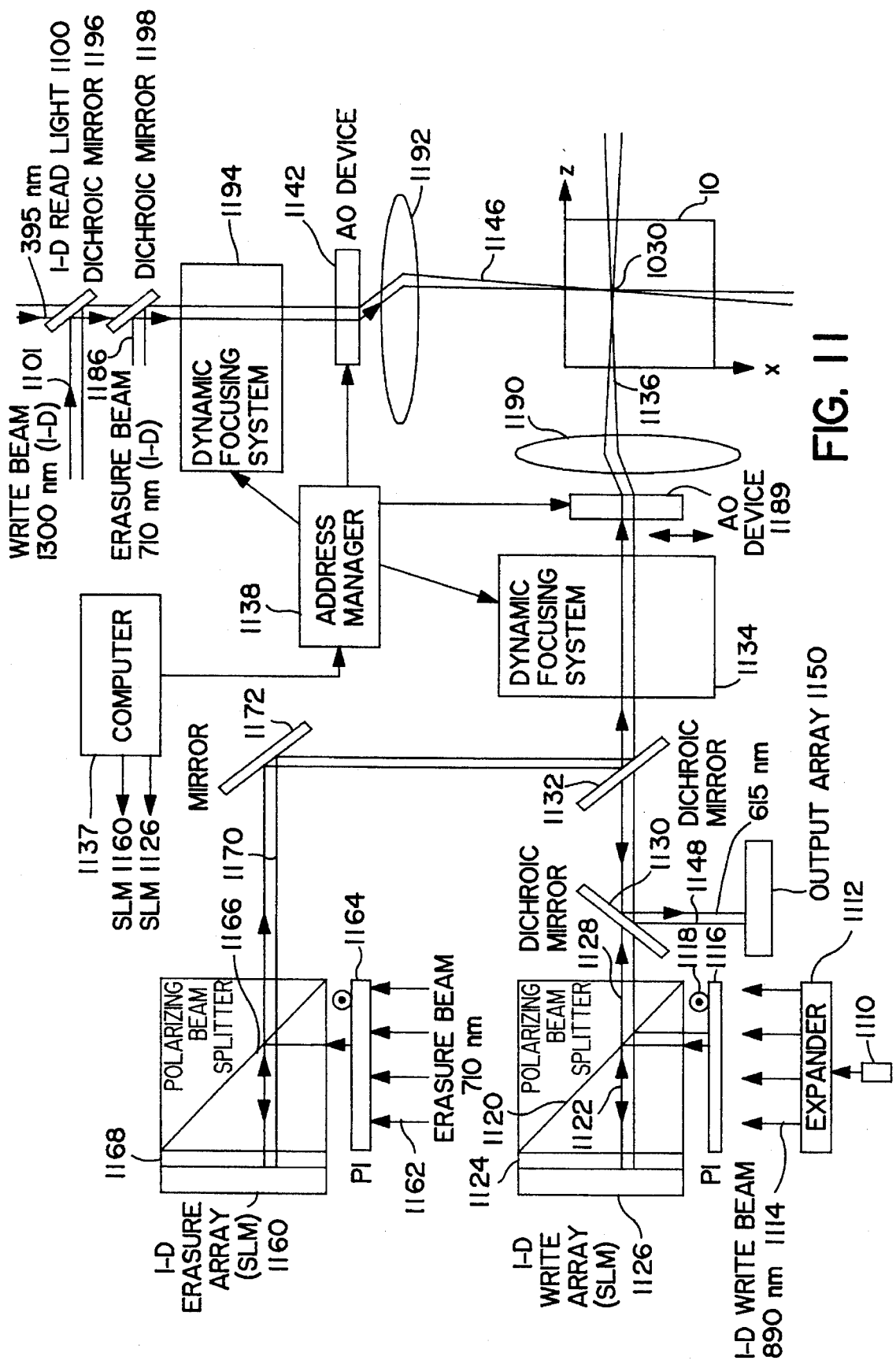
FIG. 11 is a simplified block diagram of another embodiment of the invention similar to FIG. 4, in which an optical memory block is addressed in a quasi-one-dimensional manner by crossed beams.

According to another aspect of the invention, light source 1012 of FIG. 10a includes a two-dimensional column modulator, such as an 8×1024 modulator. While it is actually a two-dimensional modulator, its dimensions are so much like a column that it may be considered to be quasi-one-dimensional (q-1-D). Thus, this approach may be termed "q-1-D." FIG. 11 is a simplified block diagram of a memory system according to the q-1-D approach, and is generally similar to FIG. 4. In FIG. 11, elements corresponding to those of FIG. 4 are designated by like reference numerals in the 1100 series rather than the 400 series. In FIG. 11, an unmodulated WRITE light source 1110 at 890 nm is applied to a 1-D or line beam expander 1112, which generates unmodulated 1-D WRITE beam 1114. A polarizer 1116 polarizes beam 1114 in the direction of arrowhead 1118, and the resulting polarized beam is reflected by polarized beam splitter 1120, to form beam 1122. Beam 1122 is applied through a quarter-wave plate 1124 for polarization rotation, and is applied to a q-1-D (8×1024 pixel) spatial light modulator 1126, to which the information to be written to the memory cube is also applied from computer 1137. The spatial light modulator lies parallel to line beam 1122, and the pixels are modulated by the information, to produce a 1-D WRITE beam, modulated by reflection of the associated pixels of the SLM. The modulated beam passes through quarter-wave plate 1124 to complete its polarization rotation, emerging as a beam 1128. Beam 1128 passes through beam splitter 1120, and through mirrors 1132 and 1148, and through a focussing system 1134 which may include a zoom lens controlled by address manager 1138. From focussing system 1134, the modulated 1-D beam passes through an acoustooptic device controlled by address manager 1138, for being deflected to cause beam 1128 to traverse the column to be written, and the deflected modulated beam 1136 is refocussed by a lens system 1190 as a sheet within cube 10. Lens system 1190 in effect adjusts the focus of beam 1136 to place the waist of the beam near the desired intersection column 1030 within the cube. However, the modulated 890 nm WRITE beam 1136 does not have the intensity at any location within cube 10 to write datels.

At the same time that modulated beam 1136 is applied to cube 10, a second unmodulated sheet WRITE beam 1146 at 1300 nm is applied from an orthogonal direction, as generally described in conjunction with FIGS. 10*a*, 10*b*, and 10*c*. Beam 1146 of FIG. 11 originates as beam 1101 from a source (not illustrated in FIG. 11), is reflected from dichroic mirror 1196, and passes through dichroic mirror 1198 to a dynamic focussing system 1194 and acoustooptic device 1142, both controlled by address manager 1138, which adjust the focus of beam 1146 to place the waist of beam near the desired intersection point within the cube. Beam 1146 alone also lacks sufficient energy to cause writing, but at the intersection column 1030, the combined energies are sufficient to write at the bright spots resulting from the reflective pixels of spatial light modulator 1126. Unmodulated WRITE beam 1146 may be viewed as "sensitizing" a plane of memory material, so that writing may be accomplished in the sensitized plane by the bright spots of intersecting modulated WRITE beam 1128.

The sparsing of the beams described in conjunction with FIGS. 5, 6*a* and 6*b* is for the purpose of prevention of writing to pages of the memory material which are closer to and farther from the WRITE beam source (adjacent pages in the Z direction) than the page to which data is to be written. The possibility of writing to such adjacent pages, in turn, arose from the high power density of the WRITE beam, and from the possibility of overlapping of the beams of adjacent datels being written. In the embodiment of FIGS. 10*a*, 10*b*, 10*c*, and 11, the possibility of crosstalk to adjacent pages does not exist, because neither of the two intersecting beams alone has enough power density to write, and, so long as the waist region of unmodulated sheet WRITE beam 1146 is sufficiently small in the intersection region, it "sensitizes" only one page, and there is no possibility of writing to pages which are adjacent in the Z direction. Consequently, the modulated WRITE beams need not be sparse in the X direction. However, crosstalk between datels can take place in the Y direction, because the unmodulated WRITE beam sensitizes an area, rather than a line, in the XY plane. Therefore, the WRITE beam must be sparse in the Y direction.

Figure 12A:
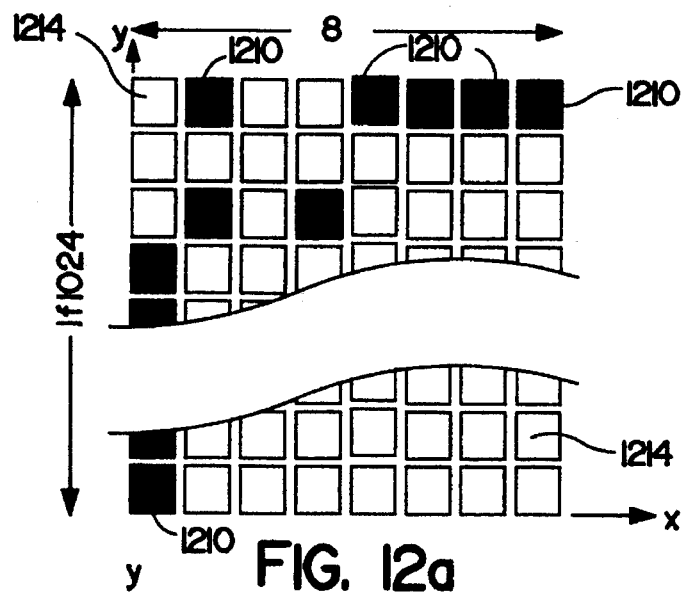
FIG. 12a is a frontal view of a quasi-one-dimensional spatial light modulator useful in the arrangement of FIG. 11.
Figure 12B:
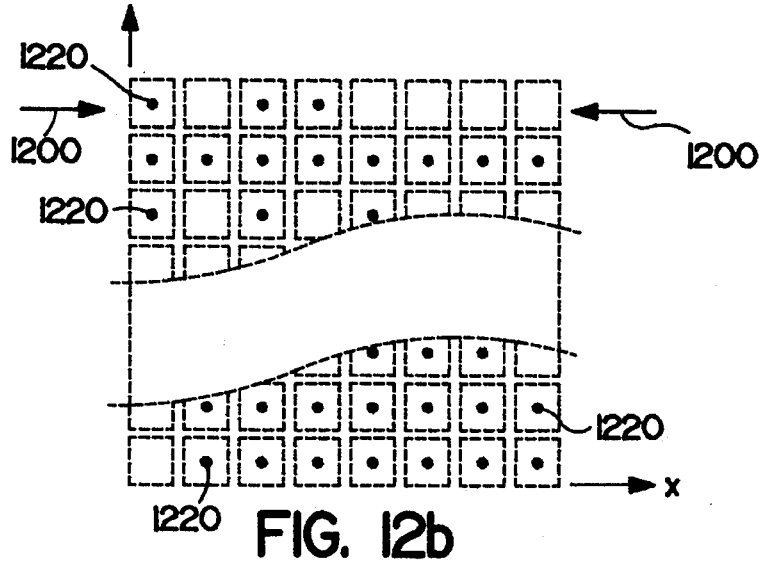
FIG. 12b represents a cross-section of a focussed light beam array pattern responsive to the spatial light modulator of FIG. 12a, and FIG. 12c represents the result of compressing the pattern of FIG. 12b in a horizontal direction.
Figure 12C:
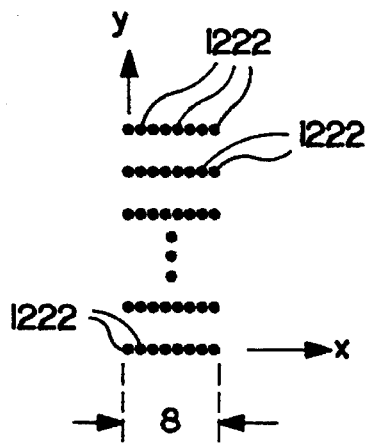

FIG. 12*a* is a view of a portion of 8× 1024 spatial light modulator array 1126 of FIG. 11, in which there are eight pixels horizontally, and 1024 pixels vertically. Shaded pixels, such as pixels 1210, are absorptive, and modulate the write light beam with a "dark" spot of zero intensity (no writing), while the unshaded pixels, such as pixels 1212, represent reflective pixels which produce bright spots when the beams are focussed. FIG. 12*b* is an illustration of the bright spots (if any exist as a result of the information being modulated) of the "invisible lattice", which occur at a focal plane in the optical system of FIG. 11 corresponding to plane 612 of FIG. 6. In FIG. 12*b*, dots 1210 represent the bright spots, which correspond with reflective pixels 1214 of FIG. 12*a*. FIG. 12*c* illustrates the result of passing the light pattern of FIG. 12*b* through cylindrical lens 1190, which results in compression of the pattern of FIG. 12*b* in the direction of arrows 1200 of FIG. 12*b*, i.e. reduces the X dimension without reducing the Y dimension. In FIG. 12*c*, all the spots 1222 are represented as bright spots for ease of understanding. The eight spots 1222 of each horizontal row are closer together in the X or horizontal direction than in FIG. 12*b*, but not closer in the Y or vertical direction. This is the definition of a beam array which is sparsed in the vertical direction. Thus, the beam produced by WRITE light source 1110 of FIG. 11 is made into a quasi-line beam by expander 1112, the beam is modulated, and the modulated beam is again passed through a cylindrical lens to reduce it to the final q-1-D form, thereby accomplishing the sparsing in the vertical direction, as explained in conjunction with FIG. 12*a*, 12*b* and 12*c*.

Erasing is accomplished in the arrangement of FIG. 11 in generally the same manner as writing. In FIG. 11, an erasure beam 1162 at 710 nm is applied through a polarizer 1164, and the polarized beam is reflected by a polarized beam splitter 1166, through a quarter-wave plate to an erase spatial light modulator similar to SLM 1126, which receives information from a source (not illustrated) relating to the datels to be erased. The modulated ERASE beam, represented as 1170 is reflected by a mirror 1172 and by dichroic mirror 1132, and then follows the same path as that described for the unmodulated WRITE beam through focussing system 1134, acoustooptic device 1188, and lens system 1190. Thus, a sheet ERASE beam modulated with the datels to be erased is applied to memory cube 10, at a power level insufficient to erase. At the same time, a second, unmodulated ERASE beam 1186 is reflected by dichroic mirror 1196, and follows the same path therefrom as the unmodulated READ beam 1100, through focussing system 1194, acoustooptic device 1142, and lens system 1192, into cube 10. The modulated and unmodulated ERASE beams intersect in a column, with bright spots at the locations to be erased, much as described in conjunction with the READ function. Alternatively, if entire columns are to be erased simultaneously, erasure beam 1162 can be applied directly to mirror 1172, without passing through SLM 1160.

Reading is accomplished in the arrangement of FIG. 11 in a manner generally similar to that described in conjunction with FIG. 4, in that a planar light beam is passed through the block of memory material, to cause one-photon absorption by the signal component of the memory material. In FIG. 11, a READ light beam 1100 at 395 nm from a source (not illustrated) is applied through dichroic mirrors 1196 and 1198, and thereafter the READ light beam follows the same path as the above described erasure beam 1186, being converted to a sheet or fan beam with a narrow waist, such as that described in conjunction with FIGS. 10*b* and 10*c*, near the region to be read. The sheet READ beam is deflected by an acoustooptic device 1192 to the appropriate Z position to intercept the column to be read. In the region illuminated by READ beam 1100 within cube 10, the signal dye associated with datels in a written state fluoresces. The fluorescence of a selected q-1-D column is imaged by lens system 1190, acoustooptic device 1189, and focussing system 1134, to form a read information beam 1148, which is coupled to an output array 1150 of detectors by dichroic mirrors 1130 and 1132. Detector array 1150 responds to the information light by producing parallel signals representing the state of each of the datels of q-1-D column 1030 which has been read. Crosstalk is avoided during reading because of the narrow waist of READ beam 1100 within the cube, whereby the memory material tends to respond at only one page, and by the narrow depth of focus of focussing system 1134, AO device 1189, and lens system 1190.

Since the positions of the beam intersections 1030 within cube 10 of FIG. 11 are established by beam deflection provided by acoustooptic devices 1142 and 1189, physical translation of the cube relative to the beam-forming structure, such as that described in conjunction with FIG. 4, is unnecessary.

Other embodiments of the invention will be apparent to those skilled in the art. For example, a plurality of light sources such as laser diodes or LEDs may be coupled to the upper edges of glass sheets 32 of block 36 of FIG. 3*b* instead of using optical fibers 40. While the memory material has been described as being dissolved in a polymer which is then solidified, there is no theoretical necessity for the active memory material to be in the solid form; it could as easily be dissolved in a fluid such as a liquid which is contained in a transparent cellular structure, in which each cell constitutes a datel. Thus, when the material is a fluid, a "slab" requires a restraining boundary. While mechanical translation of the memory block relative to the beams has been described in conjunction with FIGS. 6*a* and 6*b*, the light beams themselves can be translated by translating their effective source relative to the memory block, or both could be translated. While a paragraph/page system has been described, there is no requirement in principle that pages be subdivided. Instead of using a reflective spatial light modulator together with a polarized beamsplitter, as described, a WRITE laser array with individually controllable drivers could be used. While the sparse addressing scheme has been described as being for the WRITE function, it may be used, if desired, for either or both of READ and ERASE functions. While the light sources have been described as being lasers, other light sources with equivalent characteristics may be used. The signal dye, if used in the memory material, may respond when associated either with written or unwritten storage component of the memory material. The addressing arrangements according to the invention may be used with memory materials according to the invention or with other memory materials, and memory materials according to the invention may be used with other addressing arrangements.

What is claimed is:

1. An optical memory material, comprising:

a fulgide storage component which converts from a first state to a second state in response to two-photon absorption of WRITE light; and a signal component which responds to one-photon absorption by fluorescing only at locations at which said storage component is in one of said first and second states, and not in the other one of said first and second states.

2. A material according to claim 1, wherein said signal component responds only at locations at which said storage component is in said second state.

3. A material according to claim 1, wherein said signal component consists essentially of one of (a) 3,3'-diethyloxadicarbocyanine iodide, (b) Nile red dye, (c) Pyridine-1, (d) Pyridine-2, (e) 4-(dicyano methylene)-2 -methyl-6-(p-dimethylamino styryl)-4 H-pyran, (f) 2[4-(4-dimethylaminophenyl)- 1,3-butadienyl]-3-ethylbenzothiazolium p-toluenesulfonate, (g) 1,1',3,3,3',3' -hexamethyl-4,4',5,5'-dibenzo-2,2',indotricarbocyanine perchlorate, and (h) mixtures thereof.

4. A material according to claim 1, further comprising an associated apparatus, together forming a system, said associated apparatus comprising:

means for concentrating writing light onto at least a portion of said material, for causing said multistate storage material to absorb said photons of light by two-photon absorption, for changing said storage component from said first state to said second state; and means for irradiating at least a portion of said active materials with reading light, for causing said signal component to respond, except at those locations at which said storage component is in said one of said first and second states.

5. A system according to claim 4, wherein said means for concentrating comprises one of focussing means and crossed beam means.

6. A memory material according to claim 1, comprising:

a frequency upconversion component which, upon receipt of a beam of light, converts at least a portion of said beam of light to a higher frequency by two-photon absorption, to thereby generate at least a portion of said WRITE light.

7. A material according to claim 1, wherein said storage component consists essentially of one of (a) E-Adamantylidene [1-(2,5-dimethyl-3 -furyl)ethylidene]succinic anhydride, (b) 1-(2,5-dimethyl-3-furyl) ethylidene (isopropylidene) succinic anhydride, (c) 2,3-bis(2,4,5-trimethyl-3-thienyl) maleic anhydride, (d) cis-1,2-dicyano-1,2-bis(2,4, 5-trimethyl-3-thienyl)ethene, (e) 1,2 -dicyano-1,2bis(2-methylbenzothiophene-3-yl)ethene, (f) 2,3-bis(1,2-dimethyl-3-indolyl)maleic anhydride, and (g) mixtures thereof.

8. An optical memory material comprising:

a fulgide storage component which converts from a first state to a second state in response to two-photon absorption of WRITE light; mixed with a signal component which responds to one-photon absorption by fluorescing only at locations at which said storage component is in one of said first and second states, and not in the other one of said first and second states.

9. A material according to claim 8, wherein said storage component consists essentially of one of (a) E-Adamantylidene [1-(2,5-dimethyl-3-furyl)ethylidene] succinic anhydride, (b) 1-(2,5-dimethyl-3-furyl) ethylidene (isopropylidene) succinic anhydride, (c) 2,3-bis(2,4,5-trimethyl-3-thienyl)maleic anhydride, (d) cis-1,2-dicyano-1,2-bis(2,4,5-trimethyl-3-thienyl)ethene, (e) 1,2 -dicyano-1,2bis(2-methylbenzothiophene-3-yl)ethene, (f) 2,3-bis(1,2-dimethyl-3-indolyl)maleic anhydride, and (g) mixtures thereof.

10. A memory material according to claim 8, wherein said signal component consists essentially of one of (a) 3,3'-diethyloxadicarbocyanine iodide, (b) Nile red dye, (c) Pyridine-1, (d) Pyridine-2, (e) 4-(dicyano methylene)-2 -methyl-6-(p-dimethylamino styryl)-4 H-pyran, (f) 2[4-(4-dimethylaminophenyl)- 1,3-butadienyl]-3-ethylbenzothiazolium p-toluenesulfonate, (g) 1,1',3,3,3',3' -hexamethyl-4,4',5,5'-dibenzo-2,2',indotricarbocyanine perchlorate, and (h) mixtures thereof.

11. A material according to claim 8, further comprising an associated apparatus, together forming a system, said associated apparatus comprising:

means for concentrating writing light onto at least a portion of said material, for causing said fulgide storage component to absorb said photons of light by two-photon absorption, for changing said fulgide storage component from said first state to said second state; and means for irradiating at least a portion of said optical memory material with reading light, for causing said signal component to respond, except at those locations at which said storage component is in said one of said first and second states.

* * * * *